US012781115B2

(12) United States Patent
Filip et al.

(10) Patent No.: US 12,781,115 B2
(45) Date of Patent: Nov. 3, 2026

(54) DIELECTRIC THERMAL MANAGEMENT FLUIDS AND METHODS FOR USING THEM

(71) Applicant: Castrol Limited, Reading (GB)

(72) Inventors: Sorin Filip, Reading (GB); Giles Prentice, Reading (GB)

(73) Assignee: Castrol Limited, Reading (GB)

( * ) Notice: Subject to any disclaimer, the term of this patent is extended or adjusted under 35 U.S.C. 154(b) by 573 days.

(21) Appl. No.: 18/547,819

(22) PCT Filed: Feb. 24, 2022

(86) PCT No.: PCT/IB2022/051609
§ 371 (c)(1),
(2) Date: Aug. 24, 2023

(87) PCT Pub. No.: WO2022/180552
PCT Pub. Date: Sep. 1, 2022

(65) Prior Publication Data
US 2024/0191119 A1 Jun. 13, 2024

Related U.S. Application Data

(60) Provisional application No. 63/153,155, filed on Feb. 24, 2021.

(51) Int. Cl.
*C09K 5/10* (2006.01)
*H01M 10/613* (2014.01)
(Continued)

(52) U.S. Cl.
CPC .......... *C09K 5/10* (2013.01); *H01M 10/6567* (2015.04); *H05K 7/20272* (2013.01); *H01M 10/613* (2015.04)

(58) Field of Classification Search
CPC .. C09K 5/10; H01M 10/6567; H01M 10/613; H05K 7/20272
See application file for complete search history.

(56) References Cited

U.S. PATENT DOCUMENTS

| | | | | |
|---|---|---|---|---|
| 2,973,388 A | | 2/1961 | Randolph | |
| 3,630,917 A | * | 12/1971 | McCord | C09K 5/20 252/78.3 |

(Continued)

FOREIGN PATENT DOCUMENTS

| | | | | |
|---|---|---|---|---|
| CN | 103059819 A | * | 4/2013 | |
| CN | 111892914 A | | 11/2020 | |

(Continued)

OTHER PUBLICATIONS

Machine Translation of CN-103059819-A (Mar. 6, 2026) (Year: 2026).*

(Continued)

*Primary Examiner* — Matthew J Merkling
(74) *Attorney, Agent, or Firm* — McDonnell Boehnen Hulbert & Berghoff LLP

(57) ABSTRACT

This disclosure relates generally to thermal management fluids. More particularly this disclosure relates to a dielectric thermal management fluid suitable for use managing heat in battery systems through direct cooling, such as lithium-ion batteries used in electric vehicles, electric motors, and power electronics, methods of using such thermal management fluids, and systems including such thermal management systems.

20 Claims, 2 Drawing Sheets

(51) Int. Cl.
*H01M 10/6567* (2014.01)
*H05K 7/20* (2006.01)

(56) References Cited

U.S. PATENT DOCUMENTS

| | | | | | |
|---|---|---|---|---|---|
| 2006/0255312 | A1* | 11/2006 | Nappa | C09K 5/045 252/67 |
| 2008/0167503 | A1 | 7/2008 | Yusof et al. | |
| 2009/0186788 | A1* | 7/2009 | Tazaki | C09K 5/045 508/304 |
| 2009/0266519 | A1* | 10/2009 | Marinho | C23F 11/08 165/104.19 |
| 2015/0057627 | A1* | 2/2015 | Noda | A61F 13/5126 604/378 |
| 2021/0261801 | A1* | 8/2021 | Saitou | C09B 67/0013 |
| 2022/0259476 | A1* | 8/2022 | Short | H01M 10/625 |
| 2024/0191119 | A1* | 6/2024 | Filip | H05K 7/20272 |

FOREIGN PATENT DOCUMENTS

| | | | | | |
|---|---|---|---|---|---|
| EP | 0361493 | A1 | | 4/1990 | |
| JP | H2-256633 | A | | 10/1990 | |
| JP | H8-319478 | A | | 12/1996 | |
| JP | 2005084074 | A | | 3/2005 | |
| JP | 2007204451 | A | | 8/2007 | |
| WO | WO-2005118754 | A2 | * | 12/2005 | C09K 5/045 |
| WO | WO-2006116371 | A1 | * | 11/2006 | C11D 7/5018 |
| WO | 2015140714 | A1 | | 9/2015 | |
| WO | 2020252235 | A1 | | 12/2020 | |

OTHER PUBLICATIONS

Lee et al. "Etherification of glycerol by isobutylene. Effects of the density of acidic sites in ion-exchange resin on the distribution of products." Korean J. Chem. Eng., 2011, vol. 28, No. 3, pp. 756-762.
Mallesha et al. "An efficient synthesis of tert-butyl ethers/esters of alcohols/amino acids using methyl tert-butyl ether." Tetrahedron Letters, 2012, vol. 53, No. 6, pp. 641-645.
Riadigos et al. "Permittivity and density of the systems (monoglyme, diglyme, triglyme, or tetraglyme+n-heptane) at several temperatures" The Journal of Chemical Thermodynamics, 2011, vol. 43, No. 3, pp. 275-283.
Jia et la. "Comparative Study on Catalytic Dehydration of Glycerol with Alcohols" Journal of the Brazilian Chemical Society, 2018, vol. 30, No. 4, pp. 851-858.
Duclos et al. "Methylation of Polyols with Trimethylphosphate in the Presence of a Lewis or Bronsted Acid Catalyst." Chemsuschem, 2018, vol. 11, No. 3, pp. 547-551.
International Search Report and Written Opinion of International Application No. PCT/IB2022/051609, mailed Jun. 9, 2022, 10 pages.

* cited by examiner

DIELECTRIC THERMAL MANAGEMENT FLUIDS AND METHODS FOR USING THEM

CROSS-REFERENCE TO RELATED APPLICATIONS

This application is a U.S. national phase application of International Patent Application No. PCT/IB2022/051609, filed Feb. 24, 2022, which claims the benefit of priority of U.S. Provisional Patent Application No. 63/153,155, filed Feb. 24, 2021, which is hereby incorporated herein by reference in its entirety.

BACKGROUND OF THE DISCLOSURE

Field of the Disclosure

This disclosure relates generally to thermal management fluids. This disclosure relates more particularly to a dielectric thermal management fluid suitable for use managing heat in battery systems through direct cooling, such as lithium-ion batteries used in electric vehicles, electric motors, and power electronics, methods of using such thermal management fluids, and systems including such thermal management systems.

Technical Background

The number of electric vehicles (i.e., vehicles using electric power for all or a portion of their motive power such as battery electric vehicles (BEVs), hybrid electric vehicles (HEVs), plug-in hybrid electric vehicles (PHEVs), and the like) sold globally has increased over the last several years, and is expected to continue to increase. Ultimately, the vast majority of vehicles will likely be electric. As electric vehicle technology continues to evolve, there is a need to provide improved power sources (e.g., battery systems or modules). For example, it is desirable to increase the distance that such vehicles may travel without the need to recharge the batteries, to improve the performance of such batteries, and to reduce the costs and time associated with battery charging.

Most batteries will generate heat as current is delivered to or drawn from the batteries. Typically, as the amount of current flowing into or out of the battery increases, the amount of heat that is generated also increases. If the heat that is generated is not dissipated the battery will rise in temperature. Most batteries have an effective operating temperature range, and if the battery exceeds the maximum operating temperature, the batteries can become ineffective or even result in thermal runaway and failure. In some cases, after a slight rise in temperature, a battery may be able to dissipate heat to its surroundings through a simple heat sink or without any thermal management. In other cases, a more specific thermal management system is needed to dissipate heat that is generated by the battery.

Currently, battery-powered electric vehicles almost exclusively use lithium-ion battery technology. Lithium-ion batteries offer many advantages over the comparable nickel-metal-hydride batteries, but as compared to nickel-metal-hydride batteries, lithium-ion batteries are more susceptible to variations in battery temperature and thus have more stringent thermal management requirements. For example, optimal lithium-ion battery operating temperatures are in the range of 10 and 35° C. Operation is increasingly inefficient as temperatures rise from 35 to 70° C., and, more critically, operation at these temperatures can damage the battery over time. Temperatures over 70° C. present increased risk of thermal runaway. As a result, lithium-ion batteries require specific thermal management systems to regulate their temperatures during vehicle operation. In addition, during charging, up to 10% of the inputted power ends up as heat. As the fast charging of lithium-ion batteries becomes more common, the need remains for efficient systems for thermal management of the batteries.

Lithium-ion batteries may be cooled directly or indirectly, using thermal management fluids to carry heat away from the battery component (i.e., as a cooling fluid or coolant). Direct cooling advantageously allows the thermal management fluid to come into direct contact with the hot components to carry heat away therefrom. In indirect cooling, a hot component is electrically shielded by an electrically-insulating barrier and the thermal management fluid carries away heat passing through this barrier. The most common thermal management fluids are based on mixtures of water with glycol. But because water-based fluids typically conduct electricity, they cannot be used in the direct cooling of electrical components of lithium-ion batteries. While indirect cooling allows for water-based coolants to be used, the requirement of electrical shielding can create a bottleneck for heat flow in the cooling process. There exist dielectric thermal management fluids that can be used for direct cooling of electrical components due to their non-electrically-conductive nature; examples include those conventionally used in the cooling of electrical transformers. However, the thermal properties of such dielectric thermal management fluids are typically poor in comparison to water-glycol.

Thus, there remains a need for improved dielectric thermal management systems, especially those suitable for use in the cooling of lithium-ion batteries.

SUMMARY OF THE DISCLOSURE

One aspect of the disclosure provides thermal management fluids that have a flash point of at least 100° C., measured in accordance with ASTM D93, and have a dielectric constant of at least 1.5 at 25° C. Such dielectric thermal management fluids include:

one or more dielectric compounds of formula (I):

(I)

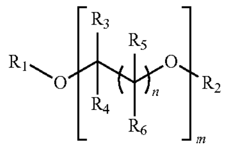

wherein

- n is an integer 1, 2, 3, 4, 5, 6, 7, 8, 9, 10, 11, or 12;
- m is an integer 1, 2, or 3;
- $R_1$ is $C_1$-$C_5$ alkyl;
- $R_2$ is $C_1$-$C_5$ alkyl;
- each $R_3$, $R_4$, $R_5$, and $R_6$ are independently selected from H, $C_1$-$C_8$ alkyl, and $R_7O$—$(CH_2)_{0-1}$—, wherein $R_7$ is $C_1$-$C_5$ alkyl,
- provided no more than two of $R_3$, $R_4$, $R_5$, and $R_6$ are $R_7O$—$(CH_2)_{0-1}$—;

the one or more dielectric compounds being present in a total amount in the range of 1 wt % to 100 wt %, based on the total weight of the thermal management fluid.

Another aspect of the disclosure provides a battery system. The battery system includes a housing; one or more electrochemical cells disposed in the housing; a fluid path extending in the housing and in substantial thermal communication with the one or more electrochemical cells; and a thermal management fluid of the disclosure as described herein disposed in the fluid path.

In another aspect, the disclosure provides an electric vehicle comprising the battery system of the disclosure as described herein.

In another aspect the disclosure provides a thermal management circuit including: a fluid path extending around and/or through a heat source; and a thermal management fluid of the disclosure, disposed in and configured to circulate in the fluid path and to absorb thermal energy produced by the heat source, wherein the fluid is disposed in the fluid path, the heat exchanger, the pump and the connecting duct.

Another aspect of the disclosure provides a method including contacting a thermal management fluid of the disclosure with a surface having a temperature of at least 25° C. (e.g., at least 30° C.), the surface being in substantial thermal communication with a heat source; and absorbing thermal energy in the thermal management fluid from the heat source through the surface.

Another aspect of the disclosure provides a method for preparing the thermal management fluid of the disclosure. Such method includes contacting a compound of formula (II)

(II)

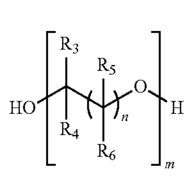

wherein n is an integer 1, 2, 3, 4, 5, 6, 7, 8, 9, 10, 11, or 12;

m is an integer 1, 2, or 3;

each $R_3$, $R_4$, $R_5$, and $R_6$ are independently selected from H, $C_1$-$C_8$ alkyl, and $R_7O—(CH_2)_{0-1}—$, wherein $R_7$ is H or $C_1$-$C_5$ alkyl, provided no more than two of $R_3$, $R_4$, $R_5$, and $R_6$ are $R_7O—(CH_2)_{0-1}—$;

with ($C_1$-$C_5$ alkyl)-L, wherein L is a leaving group to obtain a dielectric compound of the disclosure.

BRIEF DESCRIPTION OF THE DRAWINGS

The accompanying drawings are included to provide a further understanding of the compositions and methods of the disclosure, and are incorporated in and constitute a part of this specification. The drawings are not necessarily to scale, and sizes of various elements may be distorted for clarity. The drawings illustrate one or more embodiment(s) of the disclosure and, together with the description, serve to explain the principles and operation of the disclosure.

DETAILED DESCRIPTION

Figure 1:
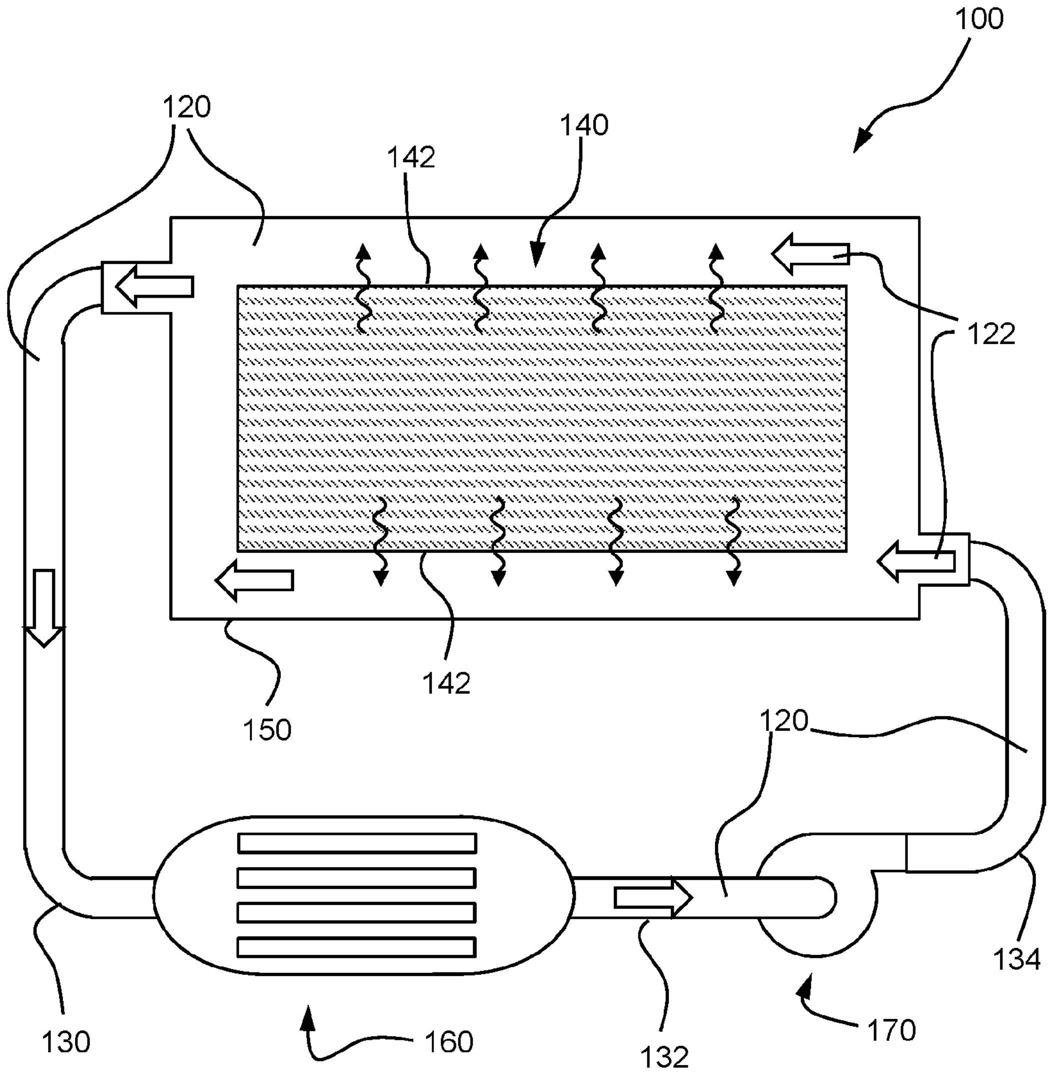
FIG. 1 is a schematic cross-sectional view of a thermal management circuit according to an embodiment of the disclosure.

The present inventors have noted that desirable thermal management fluids would in many cases have a high capacity to carry heat away in a temperature range relevant to operation of a particular electrical device or system (e.g., a lithium-ion battery), yet have a sufficiently high dielectric constant to be suitable for use in direct cooling of the device or system. Critically, because there is always a risk that oxygen might enter the overall system, desirable thermal management fluids would advantageously have a high flash point, to reduce the risk of ignition. And to provide more efficient heat transfer during the operation, desirable thermal management fluids would advantageously have low viscosity allowing for better flowability in a particular electrical device or system.

The present inventors have identified thermal management fluid compositions that provide not only a desirably low viscosity but also have a high flash point, so they can be easily pumped through a system with low-to-no risk of ignition. Specifically, the present inventors recognized that conventional dielectric fluids (e.g., organic or silicone) typically have good thermal conductivity and specific heat capacity but have undesirably high viscosity. Typical low-viscosity dielectric fluids, however, generally have unacceptably low flash points (and other ignition properties) making them unsuitable for use as coolants in systems where there is the potential for temperatures to rise where ignition is a risk. The present inventors have determined that the dielectric compounds of the disclosure can provide a thermal management fluid that does not have a low flash point and has advantageously low viscosity. These properties of the thermal management fluid make them particularly suitable, for example, for direct cooling of electrical devices and systems.

The thermal management fluids and methods of the disclosure can have a number of additional advantages over conventional fluids. Notably, the thermal management fluid of the disclosure can also, in various embodiments, provide one or more of desirably high heat conductivity, low risk of ignition, high dielectric constant, and fast temperature response. The thermal management fluid of the disclosure can in various embodiments also have lower surface tension than conventional low-viscosity dielectric fluids.

Thus, one aspect of the disclosure provides a thermal management fluid including one or more dielectric compounds of formula (I), the one or more dielectric compounds being present in a total amount in the range of 1 wt % to 100 wt %. Such thermal management fluids can have a flash point of at least 100° C., measured in accordance with ASTM D93 ("Standard Test Methods for Flash Point by Pensky-Martens Closed Cup Tester"), and a dielectric constant of at least 1.5 at 25° C.

Because there is always some risk that oxygen might enter the system, the thermal management fluids of the disclosure advantageously have a high flash point to prevent ignition. As described above, the thermal management fluids of the disclosure can have a flash point of at least 100° C., as measured in accordance with ASTM D93. For example, in various embodiments, a thermal management fluid as otherwise described herein has a flash point of at least 110° C., e.g., at least 120° C., at least 125° C., at least 130° C., or at least 135° C., measured in accordance with ASTM D93. In various embodiments, a thermal management fluid as otherwise described herein has a flash point of at least 140° C., e.g., at least 145° C., at least 150° C., or at least 155° C., measured in accordance with ASTM D93. A material that does not have a flash point below 100° C. is considered to have a flash point above 100° C. for the purposes of this disclosure, even if no flash point is measurable for the material (i.e., due to decomposition of the material at a temperature below which a flash point is measured).

A low viscosity is often desired for a thermal management fluid, to simplify the pumping thereof through a system, especially when relatively narrow passageways are used. The person of ordinary skill in the art will, based on the present disclosure, select components to provide the thermal management fluids with a desired viscosity, e.g., to be conveniently conducted through a system. Accordingly, in various embodiments, a thermal management fluid as otherwise described herein has a kinematic viscosity at 40° C. in the range of 1.5 to 20 cSt, e.g., in the range of 1.5 to 15 cSt, or 3 to 20 cSt, or 3 to 15 cSt, or 5 to 20 cSt, or 5 to 15 cSt. In various embodiments, a thermal management fluids as otherwise described herein has a kinematic viscosity at 40° C. in the range of 1.5 to 10 cSt, e.g., 1.5 to 8 cSt, or 1.5 to 6 cSt, or 3 to 10 cSt, or 3 to 8 cSt, or 3 to 6 cSt, or 5 to 10 cSt, or 5 to 8 cSt, or 5 to 6 cSt, or 6 to 10 cSt, or 8 to 10 cSt, as measured in accordance with ASTM D455. And in various embodiments, a thermal management fluids as otherwise described herein has a kinematic viscosity at 40° C. in the range of 1.5 to 5 cSt, e.g., 1.5 to 4 cSt, or 1.5 to 3 cSt, or 3 to 5 cSt, or 3 to 4 cSt, or 4 to 5 cSt, as measured in accordance with ASTM D455.

The thermal management fluids of the disclosure are desirably dielectric, so that they can be used in direct cooling applications. Accordingly, they have a dielectric constant of at least 1.5 as measured at 25° C. The dielectric constant is measured using the coaxial probe method, using ASTM D924. In various embodiments, a thermal management fluid of the disclosure has a dielectric constant of at least 1.75, e.g., at least 2.0, or at least 2.25 as measured at 25° C. In various embodiments, a thermal management fluid of the disclosure has a dielectric constant in the range of 1.5 to 10, e.g., 1.8 to 10, or 1.5 to 2.8, or 1.8 to 2.8.

In various embodiments of the disclosure, the thermal management fluid of the disclosure may have density of no more than 1.1 g/cm$^3$ at 25° C. For example, in various embodiments of the disclosure, the thermal management fluid of the disclosure may have density of no more than 1 g/cm$^3$ at 25° C.

In various embodiments of the disclosure, the thermal management fluid of the disclosure may have a heat capacity of at least 1 J/g·K, or at least 1.2 J/g·K, or even at least 1.5 J/g·K, at 25° C. In various embodiments of the disclosure, the thermal management fluid of the disclosure may have a thermal conductivity in the range of 0.05 W/m·K to 1 W/m·K at 25° C. In various embodiments of the disclosure, the thermal management fluid of the disclosure may have a coefficient of thermal expansion is no more than $1100\times10^{-6}$/K (e.g., no more than $1050\times10^{-6}$/K, or no more than $1000\times10^{-6}$/K).

As described above, the thermal management fluid of the disclosure includes one or more dielectric compounds of formula (I).

In various embodiments as otherwise described herein, in compounds of formula (I) are based on a diol central moiety. For example, in various embodiments as otherwise described herein, in compounds of formula (I) n is an integer in the range of 5-12 (i.e., any of 5, 6, 7, 8, 9, 10, 11 and 12), and $R_3$ is H or $C_1$-$C_8$ alkyl. In certain such embodiments, n is an integer in the range of 5-10, e.g., 5-8. In certain such embodiments, n is an integer in the range of 6-12, e.g., 6-10 or 6-8. In certain such embodiments, in is an integer in the range of 8-12, e.g., 8-10. For example, in certain other embodiments as otherwise described herein, in compounds of formula (I) n is an integer in the range of 1-4 (i.e., any of 1, 2, 3, and 4), and $R_3$ is H or $C_1$-$C_8$ alkyl. The person of ordinary skill in the art can use the diol chain length based on the disclosure herein to select properties of the overall material, e.g., viscosity and flash point.

In various embodiments as otherwise described herein, in diol-based compounds of formula (I) $R_3$ is H. In other embodiments, in diol-based compounds of formula (I) $R_3$ is methyl or ethyl. In other embodiments, in diol-based compounds of formula (I) $R_3$ is $C_4$-$C_8$ alkyl, e.g., $C_5$-$C_8$ alkyl or $C_6$-$C_8$ alkyl.

In various embodiments as otherwise described herein, in diol-based compounds of formula (I) each of $R_4$, $R_5$, and $R_6$ is H.

For example, in various embodiments as otherwise described herein, in diol-based compounds of formula (I) each of $R_3$, $R_4$, $R_5$, and $R_6$ is H. Such compounds have the general formula

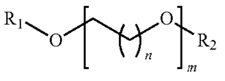

in which $R_1$, $R_2$, n and m are as otherwise described herein.

In various embodiments as otherwise described herein, in diol-based compounds of formula (I) $R_3$ is $C_1$-$C_8$ alkyl. Such diol-based compounds of formula (I) may be derived from (i.e., $R_1$- and $R_2$-substituted) 1,4-nonanediol, 3,6-nonanediol, 2,5-nonanediol, 7-methyl-1,4-octanediol, 2-pentyl-1,4-butanediol, 2-ethyl-1,4-heptanediol, 6,6-dimethyl-1,4-heptanediol, 4,7-decanediol, 6-methyl-1,4-octanediol, 2-(3-methylbutyl)-1,4-butanediol, 1,4-decanediol, 3,6-decanediol, 2,5-decanediol, 2-hexyl-1,4-butanediol, 2,6-dimethyl-1,4-heptanediol, 1,4-undecanediol, 8-methyl-1,4-nonanediol, 2,5-undecanediol, 2-heptyl-1,4-butanediol, 7-ethyl-1,4-nonanediol, and the like diols. In various embodiments, in diol-based compounds of formula (I) $R_3$ is $C_1$-$C_8$ alkyl (such as methyl or ethyl, or such as $C_6$-$C_8$ alkyl) and each of $R_4$, $R_5$, and $R_6$ is H. Such compounds have the general formula

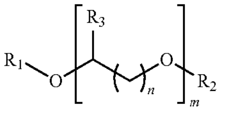

in which $R_1$, $R_2$, n and m are as otherwise described herein.

In various embodiments as otherwise described herein, in diol-based compounds of formula (I), m is 1. Such compounds have the general formula

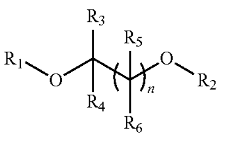

in which $R_1$, $R_2$, $R_3$, $R_4$, $R_5$, $R_6$ and n are as otherwise described herein. For example, certain such compounds have the structure

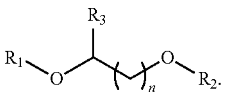

In various embodiments as otherwise described herein, in diol-based compounds of formula (I), m is 1; n is an integer 6, 7, 8, 9, or 10; and $R_4$, $R_5$ and $R_6$ are independently H. In certain such embodiments, $R_1$ is $C_3$-$C_5$ alkyl; and $R_2$ is $C_3$-$C_5$ alkyl. In certain such embodiments, $R_3$ is H.

For example, in various embodiments as otherwise described herein, compounds of formula (I) have the formula

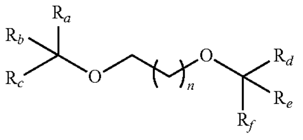

in which each of $R_a$ and $R_b$ is independently methyl, and each of $R_c$ and $R_d$ is independently methyl or ethyl.

The disclosure also contemplates dielectric compounds based on a triol core moiety. Thus, in various embodiments as otherwise described herein, in compounds of formula (I) n is 1, and $R_3$ is $R_7O$—$(CH_2)_{0-1}$—, such as $R_7O$—$CH_2$—.

In various embodiments as otherwise described herein, in triol-based compounds of formula (I) each of $R_4$, $R_5$, and $R_6$ is H. Such compounds have a glycerol core moiety. In other embodiments as otherwise described herein, each $R_4$, $R_5$ and $R_6$ is independently H, methyl or ethyl, e.g., H or methyl.

In various embodiments as otherwise described herein, in triol-based compounds of formula (I) m is 1.

In various embodiments as otherwise described herein, in triol-based compounds of formula (I), m is 1; and $R_4$, $R_5$ and $R_6$ are independently H. In certain such embodiments, $R_1$ is $C_3$-$C_5$ alkyl; $R_2$ is $C_3$-$C_5$ alkyl; and $R_7$ is $C_3$-$C_5$ alkyl.

For example, in various embodiments as otherwise described herein, compounds of formula (I) have the formula

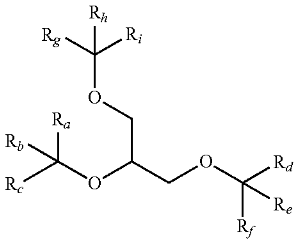

in which each of $R_a$, $R_b$, $R_d$, $R_e$, $R_g$ and $R_h$ is independently methyl, and each of $R_c$, $R_f$, and $R_i$ is independently methyl or ethyl.

The disclosure also contemplates dielectric compounds based on a tetrol core moiety. Thus, in various embodiments as otherwise described herein, in compounds of formula (I) n is 2, and one $R_5$ and one $R_6$ are independently $R_7O$—$(CH_2)_{0-1}$—, such as $R_7O$—$CH_2$—.

In various embodiments as otherwise described herein, in tetrol-based compounds of formula (I) $R_3$ and $R_4$ are independently H. In other embodiments as otherwise described herein, $R_3$, $R_4$, one of $R_5$ and one of $R_6$ is independently H, methyl or ethyl, e.g., H or methyl.

In various embodiments as otherwise described herein, in tetrol-based compounds of formula (I) m is 1.

In various embodiments as otherwise described herein, in tetrol-based compounds of formula (I), m is 1; and $R_3$, $R_4$, one of $R_5$ and one of $R_6$ is independently H. In certain such embodiments, $R_1$ is $C_3$-$C_5$ alkyl; $R_2$ is $C_3$-$C_5$ alkyl; and $R_7$ is $C_3$-$C_5$ alkyl.

For example, in various embodiments as otherwise described herein, compounds of formula (I) have the formula

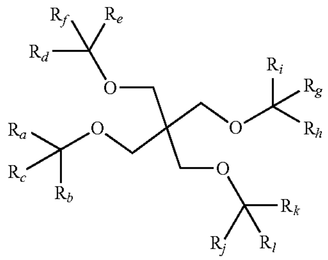

in which each of $R_a$, $R_b$, $R_d$, $R_e$, $R_g$, $R_h$, $R_e$, $R_j$, and $R_k$ is independently methyl, and each of $R_c$, $R_f$, $R_i$, and $R_l$ is independently methyl or ethyl.

The person of ordinary skill in the art can select the chain length and branching of $R_7$ based on the disclosure herein to select properties of the overall material, e.g., viscosity and flash point. In various embodiments as otherwise described herein, in triol-based or tetrol-based compounds of formula (I) $R_7$ is $C_3$-$C_5$ alkyl. In various embodiments as otherwise described herein, in triol-based or tetrol-based compounds of formula (I) $R_7$ is a branched $C_1$-$C_5$ alkyl, such as branched $C_3$-$C_5$ alkyl. Branching of $R_7$ can be, for example, at an α-position to the oxygen atom to which $R_7$ is bound. In various embodiments as otherwise described herein, in triol-based or tetrol-based compounds of formula (I) $R_7$ is —$C(R_g)(R_h)(R_i)$, wherein each of $R_g$, $R_h$ and $R_i$ is independently methyl or ethyl.

The person of ordinary skill in the art can select the chain length and branching of $R_1$ based on the disclosure herein to select properties of the overall material, e.g., viscosity and flash point. In various embodiments as otherwise described herein, in one or more dielectric compounds of formula (I) $R_1$ is $C_3$-$C_5$ alkyl. In various embodiments as otherwise described herein, in one or more dielectric compounds of formula (I) $R_1$ is a branched $C_1$-$C_5$ alkyl, such as branched $C_3$-$C_5$ alkyl. Branching can be, for example, at an α-position or at a β-position with respect to the oxygen atom to which $R_1$ is bound. In various embodiments, branching is at an α-position with respect to the oxygen atom. For example, in various embodiments as otherwise described herein, in one or more dielectric compounds of formula (I) $R_1$ is an α-branched $C_1$-$C_5$ alkyl, such as t-butyl or t-pentyl. In various embodiments as otherwise described herein, in one or more dielectric compounds of formula (I) $R_1$ is —$C(R_a)(R_b)(R_c)$, wherein each of $R_a$, $R_b$, and $R_c$ is independently methyl or ethyl.

The person of ordinary skill in the art can select the chain length and branching of $R_2$ based on the disclosure herein to select properties of the overall material, e.g., viscosity and flash point. In various embodiments as otherwise described herein, in one or more dielectric compounds of formula (I) $R_2$ is $C_3$-$C_5$ alkyl. In various embodiments as otherwise described herein, in one or more dielectric compounds of formula (I) $R_2$ is a branched $C_1$-$C_5$ alkyl, such as branched $C_3$-$C_5$ alkyl. Branching can be, for example, at an α-position or at a β-position with respect to the oxygen atom to which $R_2$ is bound. In various embodiments, branching is at an α-position with respect to the oxygen atom. For example, in various embodiments as otherwise described herein, in one or more dielectric compounds of formula (I) $R_2$ is an α-branched $C_1$-$C_5$ alkyl, such as t-butyl or t-pentyl. In various embodiments as otherwise described herein, in one or more dielectric compounds of formula (I) $R_2$ is —$C(R_d)(R_e)(R_f)$, wherein each of $R_a$, $R_b$, and $R_c$ is independently methyl or ethyl.

In various embodiments as otherwise described herein, in one or more dielectric compounds of formula (I) $R_1$ and $R_2$ are the same. In various embodiments as otherwise described herein, in one or more dielectric compounds of formula (I) in which $R_3$ is $R_7O$—$(CH_2)_{0-1}$—, $R_1$, $R_2$ and $R_7$ are the same. In various embodiments as otherwise described herein, in one or more dielectric compounds of formula (I) in which one $R_5$ and one $R_6$ are independently $R_7O$—$(CH_2)_{0-1}$—, $R_1$, $R_2$ and each $R_7$ are the same.

In various embodiments as otherwise described herein, in one or more dielectric compounds of formula (I) $R_1$ and $R_2$ are different. In various embodiments as otherwise described herein, in one or more dielectric compounds of formula (I) in which $R_3$ is $R_7O$—$(CH_2)_{0-1}$—, $R_1$, $R_2$ and $R_7$ are different. In various embodiments as otherwise described herein, in one or more dielectric compounds of formula (I) in which one $R_5$ and one $R_6$ are independently $R_7O$—$(CH_2)_{0-1}$—, $R_1$, $R_2$ and each $R_7$ are different.

In various embodiments as otherwise described herein, the one or more dielectric compounds of formula (I) contain a total number of carbon atoms from 10 to 50 (e.g., from 10 to 40, from 10 to 30, from 10 to 20, from 16 to 50, from 16 to 40, from 16 to 30, from 16 to 20, from 18 to 50, from 18 to 40, from 18 to 30, from 18 to 20, from 20 to 50, from 20 to 40, or from 20 to 30). For example, in various embodiments the one or more dielectric compounds of formula (I) contains a total number of carbon atoms from 12 to 22. In various embodiments the one or more dielectric compounds of formula (I) contains a total number of carbon atoms from 16 to 22. In various embodiments the one or more dielectric compounds of formula (I) contains a total number of carbon atoms from 14 to 20.

Examples of the compounds of formula (I) of the disclosure include, but are not limited to:

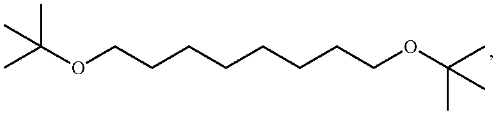,

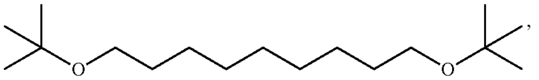,

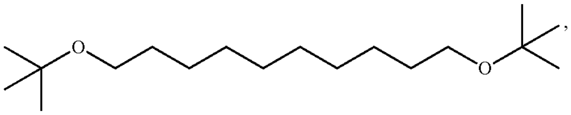,

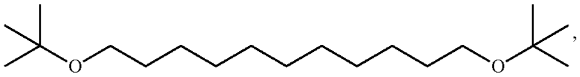,

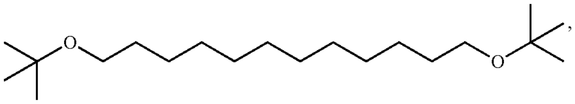,

-continued

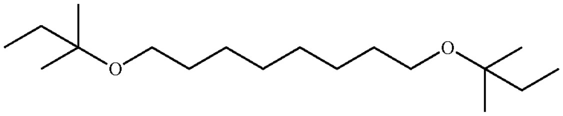,

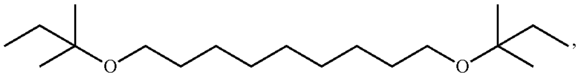,

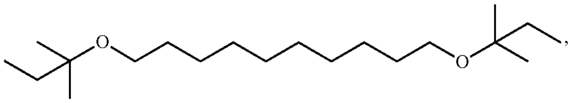,

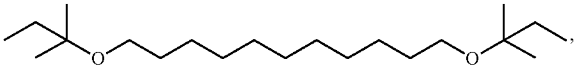,

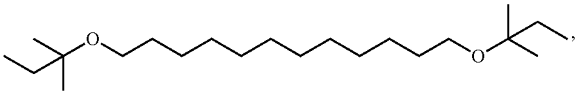,

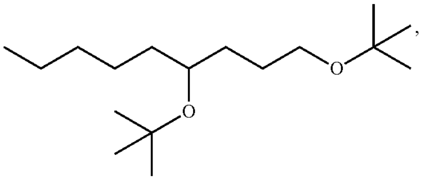,

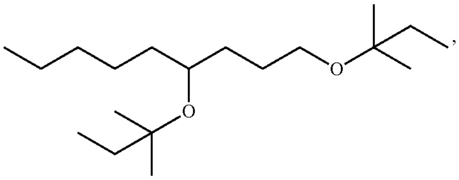,

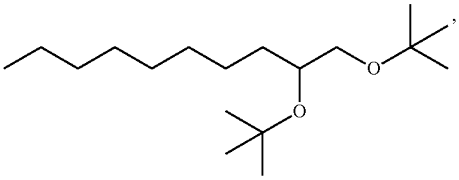,

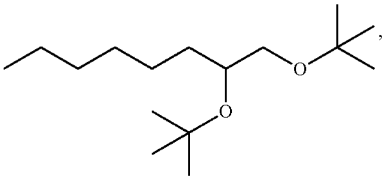,

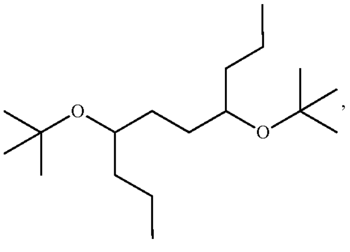,

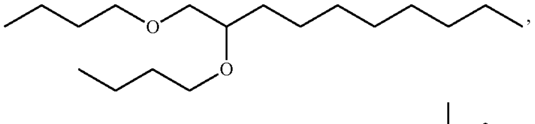,

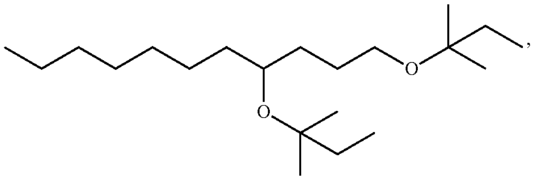,

-continued
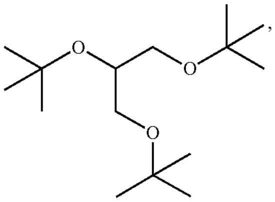,
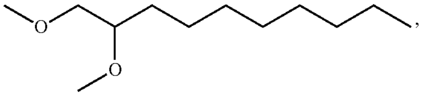,
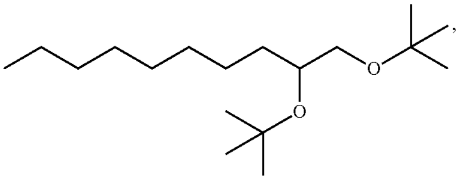,
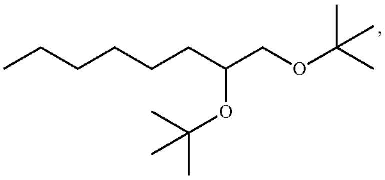,
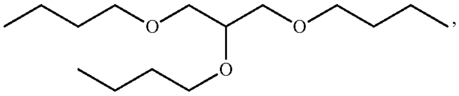,
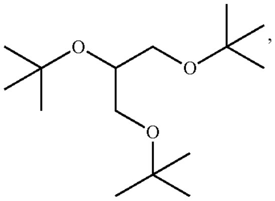,
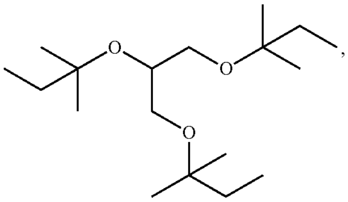,
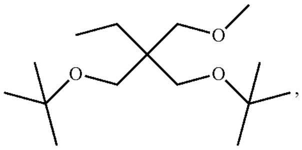,
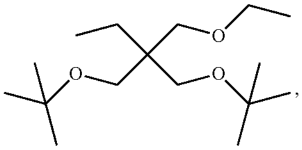,
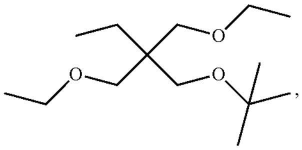,
-continued
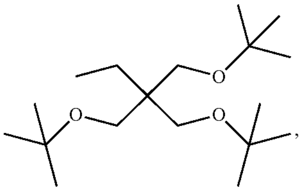,
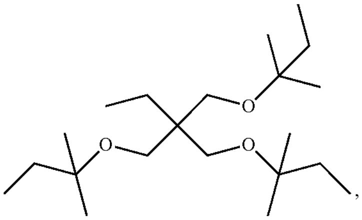,
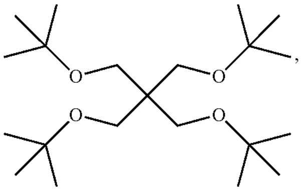,
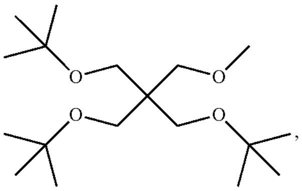,
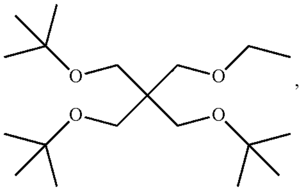, or
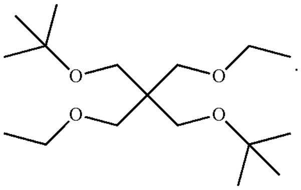.
In various embodiments, the one or more of dielectric compounds of formula (I) is
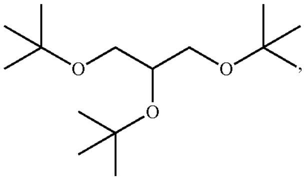,
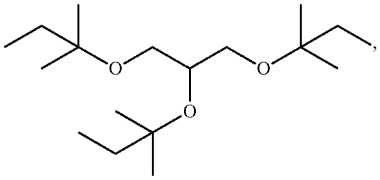, -continued

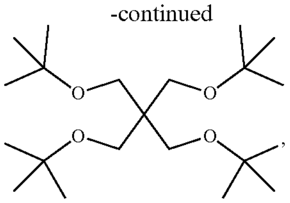

, or

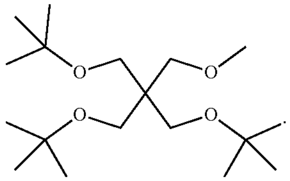

In various embodiments as otherwise described herein, the one or more dielectric compounds of the thermal management fluid have a flash point of at least 100° C. measured in accordance with ASTM D93. The present inventors have advantageously determined that the use of the dielectric compounds of the disclosure having high flash points can provide an overall thermal management fluid with a high flash point and thereby decrease the risk of ignition. In various embodiments of the thermal management fluids as otherwise described herein, the one or more dielectric compounds has a flash point of at least 110° C. (e.g., at least 120° C., at least 125° C., at least 130° C., or at least 135° C.) or at least 140° C. (e.g., at least 145° C., at least 150° C., or at least 155° C.), measured in accordance with ASTM D93.

The present inventors have advantageously determined that the one or more dielectric compounds as described herein have relatively low viscosity yet a reduced risk of ignition. Accordingly, in various embodiments of the thermal management fluids as otherwise described herein, the one or more dielectric compounds has a kinematic viscosity at 40° C. in the range of 1.5 to 20 cSt, e.g., in the range of 1.5 to 15 cSt, or 3 to 20 cSt, or 3 to 15 cSt, or 5 to 20 cSt, or 5 to 15 cSt. In various embodiments of the thermal management fluids as otherwise described herein, the one or more dielectric compounds has a kinematic viscosity at 40° C. in the range of 1.5 to 10 cSt, e.g., 1.5 to 8 cSt, or 1.5 to 6 cSt, or 3 to 10 cSt, or 3 to 8 cSt, or 3 to 6 cSt, or 5 to 10 cSt, or 5 to 8 cSt, or 5 to 6 cSt, or 6 to 10 cSt, or 8 to 10 cSt, as measured in accordance with ASTM D455. And In various embodiments of the thermal management fluids as otherwise described herein, the one or more dielectric compounds has a kinematic viscosity at 40° C. in the range of 1.5 to 5 cSt, or 1.5 to 4 cSt, or 1.5 to 3 cSt, or 3 to 5 cSt, or 3 to 4 cSt, or 4 to 5 cSt, as measured in accordance with ASTM D455.

The person of ordinary skill in the art will appreciate that various combinations of dielectric compounds of the disclosure can be used in thermal management fluids of the disclosure. Accordingly, embodiments of dielectric compounds described above can be combined in any number and in any combination in thermal management fluids of the disclosure. When two or more dielectric compounds are used in a thermal management fluid, the relative amounts of the two can be varied based on the disclosure herein, depending on the effect desired. In various embodiments, the mass ratio of a first dielectric compound to a second dielectric compound is in the range of 1:9 to 9:1 (e.g., 1:5 to 5:1, or 1:5 to 1:1, or 1:1 to 5:1).

The one or more dielectric compounds can be present in the thermal management fluids described herein in a variety of amounts. In various embodiments as otherwise described herein, the one or more dielectric compounds is present in a total amount in the range of 1 wt % to 100 wt % (e.g., 5 wt % to 100 wt %, or 10 wt % to 100 wt %, or 20 wt % to 100 wt %) based on the total weight of the thermal management fluid. For example, in various embodiments of the thermal management fluid as otherwise described herein, the one or more dielectric compounds is present in a total amount in the range of 1 wt % to 99.9 wt % (e.g., 5 wt % to 99.9 wt %, or 10 wt % to 99.9 wt %, or 20 wt % to 99.9 wt %), or 50 wt % to 99.9 wt %, for example, 75 wt % to 99.9 wt %, or 85 wt % to 99.9 wt %, or 90 wt % to 99.9 wt %, or 95 wt % to 99.9 wt %, or 98 wt % to 99.9 wt %, based on the total weight of the thermal management fluid. In various embodiments of the thermal management fluid as otherwise described herein, the one or more dielectric compounds is present in a total amount in the range of 1 wt % to 99 wt % (e.g., 5 wt % to 99 wt %, or 10 wt % to 99 wt %, or 20 wt % to 99 wt %), or 50 wt % to 99 wt %, for example, 75 wt % to 99 wt %, or 85 wt % to 99 wt %, or 90 wt % to 99 wt %, or 95 wt % to 99 wt %, based on the total weight of the thermal management fluid. In various embodiments of the thermal management fluid as otherwise described herein, the one or more dielectric compounds is present in a total amount in the range of 1 wt % to 95 wt % (e.g., 5 wt % to 95 wt %, or 10 wt % to 95 wt %, or 20 wt % to 95 wt %), or 50 wt % to 95 wt %, for example, 75 wt % to 95 wt %, or 85 wt % to 95 wt %, based on the total weight of the thermal management fluid. In various embodiments of the thermal management fluid as otherwise described herein, the one or more dielectric compounds is present in a total amount in the range of 1 wt % to 85 wt % (e.g., 5 wt % to 85 wt %, or 10 wt % to 85 wt %, or 20 wt % to 85 wt %), or 50 wt % to 85 wt %, for example, 65 wt % to 85 wt %, or 75 wt % to 85 wt %, based on the total weight of the thermal management fluid. The person of ordinary skill in the art will, based on the disclosure herein, provide the dielectric compound(s) in an amount to provide a desired high flash point to the thermal management fluid, in addition with any other desired properties (e.g., viscosity).

As the person of ordinary skill in the art will appreciate based, the thermal management fluids of the disclosure can also include a variety of other components, such as those conventional in compositions for thermal management applications. For example, the thermal management fluid may further include an oil, e.g., a mineral oil, a synthetic oil, or a silicone oil. For example, in various embodiments, the oil is a low-viscosity Group II, III, IV, or V base oil as defined by the American Petroleum Institute (API Publication 1509). These are shown in Table 1.

TABLE 1

| Base Oil Stocks API Guidelines | | | |
|---|---|---|---|
| | Saturates | Sulfur content | Viscosity Index (VI) |
| Group I | <90 and/or | >300 ppm and | ≥80 and <120 |
| Group II | ≥90 and | ≤300 ppm and | ≥80 and <120 |
| Group III | ≥90 and | ≤300 ppm and | ≥120 |
| Group IV | Includes polyalphaolefins (PAO) and GTL (gas-to-liquid) products | | |
| Group V | All other base oils not included in Groups I, II, III or IV | | |

Group II and Group III base oils (such as hydrocracked and hydroprocessed base oils as well as synthetic oils such as hydrocarbon oils, polyalphaolefins, alkyl aromatics, and synthetic esters) and Group IV base oils (such as polyalphaolefins (PAO)) are wells known base oils. Oils suitable for use as transformer oils can, in many embodiments, be suitable for use in the compositions, systems and methods of the disclosure. For example, esters also form a useful base oil stock, including synthetic esters, as do GTL (gas-to-liquid) materials, particularly those derived from a hydrocarbon source. For example, the esters of dibasic acids with monoalcohols, or the polyol esters of monocarboxylic acid may be useful as base stocks of the disclosure. Bio-derived oils such as fatty acid methyl esters may also be useful.

In various embodiments, the thermal management fluid of the disclosure further comprises a Group II, Group III, Group IV, or Group V base oil. For example, in various embodiments, the thermal management fluid of the disclosure further comprises a Group II or Group III base oil. In certain other embodiments, the thermal management fluid of the disclosure further comprises a Group IV base oil such as polyalphaolefins (PAO). In certain other embodiments, the thermal management fluid of the disclosure further comprises an ester base oil stock.

In various embodiments, the thermal management fluid of the disclosure further comprises one or more of corrosion inhibitors, anti-oxidants (such as phenolic and aminic anti-oxidants), pour point depressants, antifoams, defoamers, viscosity index modifiers, preservatives, biocides, surfactants, seal swell additives, and combinations thereof. In various embodiments, corrosion inhibitors, anti-oxidants (such as phenolic and aminic anti-oxidants), pour point depressants, antifoams, defoamers, viscosity index modifiers, preservatives, biocides, surfactants, seal swell additives, and combinations thereof, for example, may be present in an amount up to 5.0 wt %, based on the total weight of the thermal management fluid. In certain such embodiments, one or more of corrosion inhibitors, anti-oxidants (such as phenolic and aminic anti-oxidants), pour point depressants, antifoams, defoamers, viscosity index modifiers, preservatives, biocides, surfactants, seal swell additives, and combinations thereof are present in an amount in the range of 0.2 wt % to 5.0 wt %, e.g., 1.0 wt % to 2.0 wt %, or 0.2 wt % to 1.0 wt %, or 0.2 wt % to 0.5 wt %, or 0.05 wt % to 0.2 wt %, based on the total weight of the thermal management fluid. In various embodiments, the thermal management fluid of the disclosure further comprises one or more flame retardants, e.g., in an amount up to 20 wt %, up to 10 wt %, or up to 5 wt %, based on the total weight of the thermal management fluid. In other embodiments, however, no flame retardant is present.

Another aspect of the disclosure provides a method comprising contacting a thermal management fluid as described herein with a surface having a temperature of at least 25° C., the surface being in substantial thermal communication with a heat source, and absorbing thermal energy in the thermal management fluid from the heat source through the surface.

The contacting of the thermal management fluid with the surface can be dynamic or static (i.e., conductive). For example, in various embodiments, the contacting of the thermal management fluid with the surface can be performed by circulating, e.g., by pumping or otherwise flowing, the fluid over the surface. In various embodiments, the contacting can also be performed without circulation, e.g., by contacting the surface with the thermal management fluid that is a stationary body of fluid.

The temperature of the surface can vary; the thermal management fluid can be adapted for use with a variety of temperatures. In various embodiments as otherwise described herein, the temperature of the surface is in the range of 25 C to 150° C., e.g., 25° C. to 100° C., or 25° C. to 90° C., or 25° C. to 85° C., or 25° C. to 80° C., or 25° C. to 75° C., or 25° C. to 70° C. In various embodiments as otherwise described herein, the temperature of the surface is in the range of 30 C to 150° C., e.g., 30° C. to 100° C., or 30° C. to 90° C., or 30° C. to 85° C., or 30° C. to 80° C., or 30° C. to 75° C., or 30° C. to 70° C. In various embodiments as otherwise described herein, the temperature of the surface is in the range of 40° C. to 150° C., e.g., 50° C. to 150° C., or 60° C. to 150° C., or 70° C. to 150° C., or 80° C. to 150° C., or 90° C. to 150° C., or 100° C. to 150° C., or 110° C. to 150° C. In various embodiments as otherwise described herein, the temperature of the surface is in the range of 50° C. to 150° C., e.g., 50° C. to 140° C., or 50° C. to 130° C., or 50° C. to 120° C., or 50° C. to 110° C., or 50° C. to 100° C., or 50° C. to 90° C., or 50° C. to 80° C. The temperature of the surface in various embodiments (and at certain times during operation of a device or system) is no more than a boiling point of any of the one or more dielectric compounds of formula (I) of the thermal management system. In various embodiments, throughout the contacting, each of the one or more dielectric compounds of formula (I) does not reach its boiling point.

An embodiment of the method of the disclosure is illustrated with reference to FIG. 1. A thermal management circuit 100 is shown in a schematic cross-sectional side view in FIG. 1. The thermal management circuit 100 includes a thermal management fluid 120 that is circulated through the circuit and passes over surface 142. The temperature of surface 142 is elevated in comparison to the temperature of thermal management fluid 120. As a result, thermal energy is absorbed in thermal management fluid 120 from surface 142.

In various embodiments as otherwise described herein, the method includes producing the thermal energy by operating an electrical component. For example, thermal management circuit 100 is associated with electrical component 140, which produces heat during operation. In various embodiments the heat is produced as elements of the electrical component charge and discharge. As will be understood by those of ordinary skill in the art, inefficiencies in the operation of the electrical component and resistances in the circuits corresponding circuits create heat as current passes through the circuits and elements of the electrical component. For example, the heat from the operation of electrical component 140 causes surface 142 to rise in temperature, which then results in the transfer of thermal energy to thermal management fluid 120. In other embodiments, the thermal energy is produced by a chemical reaction, such as an exothermic reaction, or by friction. In still other embodiments, the thermal management fluid is chilled and absorbs thermal energy from surfaces at ambient or slightly elevated temperatures.

In various embodiments as otherwise described herein, the electrical component includes a battery system, a capacitor, inverter, electrical cabling, a fuel cell, a motor, or a computer. For example, in various embodiments the electrical component is a battery system that includes one or more electrochemical cells disposed in a housing. In other embodiments the electrical component is one or more capacitors, such as an electrolytic capacitor or an electric double-layer capacitor, e.g., a supercapacitor. In still other embodiments, the electrical component is one or more fuel cells, such as a polymer electrolyte membrane fuel cell, a direct methanol fuel cell, an alkaline fuel cell, a phosphoric acid fuel cell, a molten carbonate fuel cell, a solid oxide fuel cell, or a reversible fuel cell. In various embodiments the electrical component is an electric motor. In other embodiments, the electrical component is a computer, for example a personal computer or a server. Still, in other embodiments, the electrical component is a high power charging equipment.

The electrical component of the disclosure can operate on direct current (DC) or alternating current (AC). In various embodiments as otherwise described herein, the electrical component operates at DC or AC voltage above 48 V. In various embodiments as otherwise described herein, the electrical component operates at DC or AC voltage above 100 V, above 200 V, or above 300 V.

In various embodiments as otherwise described herein, the surface is a surface of the electrical component. For example, in FIG. 1 a housing of 150 of electrical component 140 contains a reservoir of thermal management fluid 120. Elements of the electrical component including certain circuits that produce heat is submerged in thermal management fluid 120 and the thermal management fluid absorbs thermal energy directly from an outside surface 142 of the electrical component 140.

Figure 2:
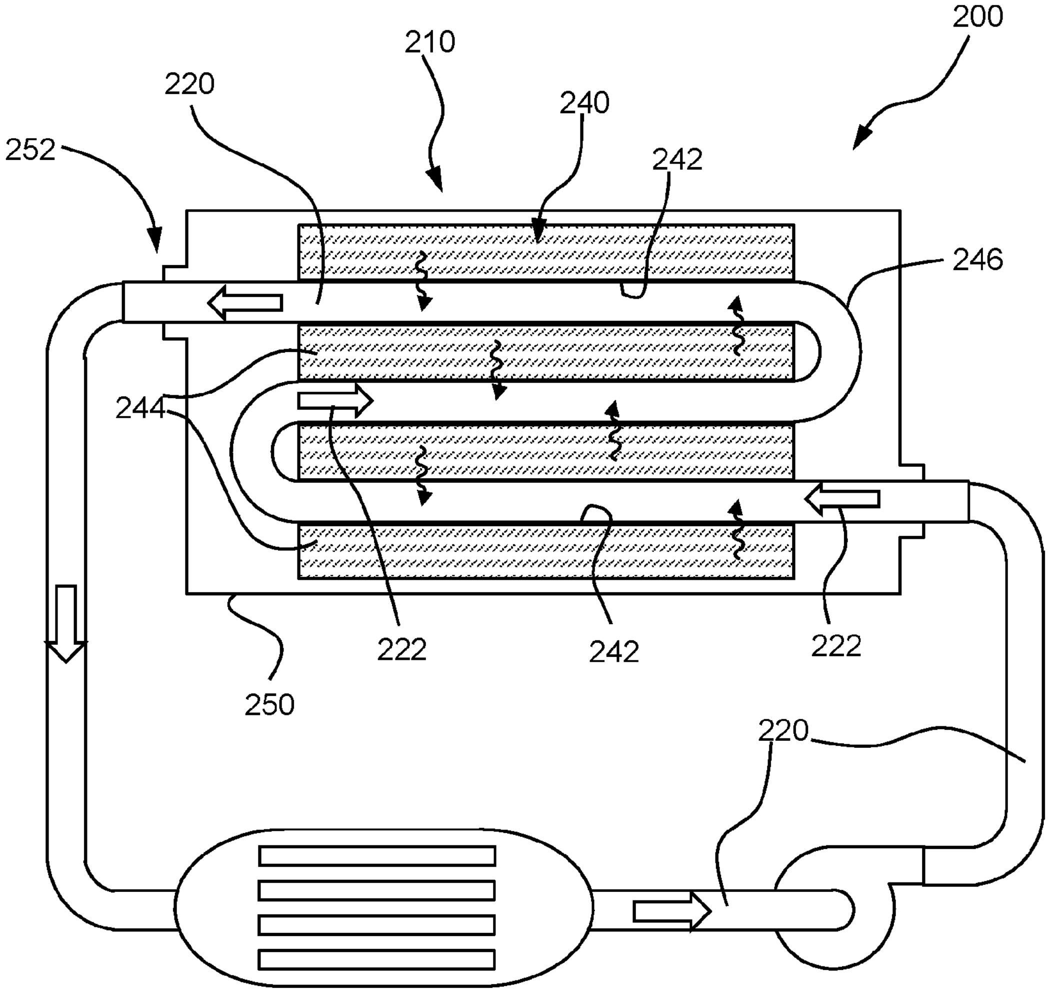
FIG. 2 is a schematic cross-sectional view of a thermal management circuit according to another embodiment of the disclosure.

In various embodiments as otherwise described herein, the surface is an internal surface of a conduit. For example, FIG. 2 shows a thermal management circuit 200 that includes electrical component 240 that includes a plurality of individual units 244. In particular, the electrical component 240 is a battery that includes a plurality of electrochemical cells 244. Electrical component 240 further includes a conduit 246 that extends through the inside of the electrical component and between the electrochemical cells 244. As the electrical component produces thermal energy, the internal surface 242 of the conduit 246 is heated and the thermal energy is absorbed by the thermal management fluid 220.

In various embodiments as otherwise described herein, the conduit passes through a housing that surrounds the electrical component. For example, conduit 246 in thermal management circuit 200 extends through apertures 252 in the housing 250 surrounding electrical component 240, which allow thermal management fluid 220 to be conveyed to other elements of the thermal management circuit 200.

Another aspect of the disclosure provides a battery system including: a housing; one or more electrochemical cells disposed in the housing; a fluid path extending through the housing and in substantial thermal communication with the one or more electrochemical cells; and a thermal management fluid according to any of the embodiments described above that is disposed in the fluid path. For example, thermal management circuit 200 in FIG. 2 includes battery system 210. The battery system includes a plurality of electrochemical cells 244 that are disposed inside housing 250. A conduit 246 forms a fluid path that extends through the housing. Thermal management fluid 220 disposed in conduit 246 is thereby placed in thermal communication with the electrochemical cells 244. As the electrochemical cells 244 charge and discharge they produce heat which is absorbed by the thermal management fluid 220. In various embodiments the electrochemical cells are subject to fast charging which yields a large amount of heat. The high heat capacity of the thermal management fluid is able to absorb this large amount of heat quickly as it is produced.

In various embodiments as otherwise described herein, the fluid path is at least partially defined by a cavity of the housing. For example, in various embodiments at least a portion of the fluid path is formed between the electrochemical cells and the inside wall of the housing, similar to fluid path 122 in component 140.

In various embodiments as otherwise described herein, the fluid path is at least partially defined by at least one conduit disposed in the housing. For example, in battery system 210, conduit 246 provides the fluid path 222 through the housing 250.

In various embodiments as otherwise described herein, the electrochemical cells are lithium-ion electrochemical cells. In other embodiments, the electrochemical cells are solid state cells, lithium-sulfur cells, lithium iron phosphate cells, lithium-ion polymer cells, sodium-ion cells, aluminum-ion cells, lead-acid cells, or magnesium-ion cells.

In various embodiments as otherwise described herein, the battery system is a component of an electric vehicle. In some embodiments, the electric vehicle is a fully electric vehicle or a hybrid electric vehicle. In other embodiments the battery system is component of a power motor, for example an electric motor or a motor in power electronics. In other embodiments the battery system is part of a stationary energy storage solution, for example a home energy storage solution that operates in cooperation with local renewable energy sources, such as solar panels or wind turbines.

Another aspect of the disclosure provides a thermal management circuit including a fluid path extending around and/or through a heat source; a thermal management fluid of according to any of embodiments described above, disposed in and configured to circulate in the fluid path and to absorb thermal energy produced by the heat source, wherein the fluid is disposed in the fluid path, the heat exchanger, the pump and the connecting duct. For example, thermal management circuit 100 shown in FIG. 1 includes a fluid path 122 that runs around electrical component 140. Thermal management fluid 120 flows through path 122 absorbing thermal energy from electronic component 140. From fluid path 122, the thermal management fluid 120 flows through a first duct 130 to heat exchanger 160. Thermal energy that has accumulated in thermal management fluid 120 is removed from the fluid within heat exchanger 160 before the fluid flows through a second duct 132 to pump 170. After pump 170, the thermal management fluid 120 passes through a third duct 134 returning it to fluid path 122 surrounding electrical component 140. Circuit 100, shown in FIG. 1, is a schematic depiction of an uncomplicated embodiment employing the described thermal management fluid. In other embodiments, the thermal management circuit includes additional elements, such as any combination of valves, pumps, heat exchangers, reservoirs and ducts.

In various embodiments of the as otherwise described herein, the heat source is a battery including a plurality of electrochemical cells, and wherein the fluid path passes between at least two of the electrochemical cells.

In various embodiments as otherwise described herein, the fluid path is defined by a housing around the electrical component. For example, housing 150 in FIG. 1 surrounds electrical component 140 and provides a cavity for thermal management fluid 120. Electrical component 140 is held in the housing at a distance from the walls of housing 150, which allows a path for thermal management fluid 120 to form between the housing 150 and the electrical component 140. While housing 150 has an enclosed shape with specific apertures 152 providing access for thermal management fluid 120, in other embodiments the top of the housing is open and the thermal management fluid is retained in the housing by gravity.

In various embodiments as otherwise described herein, the fluid path is configured to position the thermal management fluid in substantial thermal communication with the electrical component so as to absorb thermal energy produced by the electrical component. For example, in thermal management circuit 100 fluid path 122 extends around electrical component 140 and is in direct contact with the surfaces of electrical component 140. Further, in thermal management circuit 200 fluid path 222 passes through a conduit 246 that runs adjacent to the elements of electrical component 240. In both cases, the fluid path places thermal management fluid in close proximity to the electrical component so that the thermal management fluid readily absorbs thermal energy from the component.

In various embodiments as otherwise described herein, the thermal management circuit further includes a heat exchanger in fluid communication with the fluid path, wherein the thermal management fluid is configured to circulate between the fluid path and the heat exchanger to dissipate heat through the heat exchanger. In various embodiments as otherwise described herein, the heat exchanger is configured to remove heat from the thermal management fluid. For example, in thermal management circuit 100, after thermal management fluid 120 is pumped out of housing 150 it passes to heat exchanger 160 where the thermal energy is transferred to a cooler fluid, such as ambient air or a cooling liquid.

In various embodiments as otherwise described herein, the thermal management circuit includes a battery system according to any of the embodiments described above. For example, thermal management circuit 200 includes battery system 210. In various embodiments as otherwise described herein, the thermal management circuit includes an immobilized desiccant material disposed according to any of the embodiments described above. For example, thermal management circuit 300 includes battery desiccant material 360.

The particulars shown herein are by way of example and for purposes of illustrative discussion of various embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice. Thus, before the disclosed processes and devices are described, it is to be understood that the aspects described herein are not limited to specific embodiments, apparatus, or configurations, and as such can, of course, vary. It is also to be understood that the terminology used herein is for the purpose of describing particular aspects only and, unless specifically defined herein, is not intended to be limiting.

The terms "a," "an," "the" and similar referents used in the context of describing the invention (especially in the context of the following embodiments and claims) are to be construed to cover both the singular and the plural, unless otherwise indicated herein or clearly contradicted by context.

The term "alkyl" as used herein, means a straight or branched chain hydrocarbon containing from 1 to 12 carbon atoms unless otherwise specified. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, and n-decyl. When an "alkyl" group is a linking group between two other moieties, then it may also be a straight or branched chain; examples include, but are not limited to $—CH_2—$, $—CH_2CH_2—$, $—CH_2CH_2CHC(CH_3)—$, and $—CH_2CH(CH_2CH_3)CH_2—$.

All methods described herein can be performed in any suitable order of steps unless otherwise indicated herein or otherwise clearly contradicted by context. The use of any and all examples, or exemplary language (e.g., "such as") provided herein is intended merely to better illuminate the invention and does not pose a limitation on the scope of the invention otherwise claimed. No language in the specification should be construed as indicating any non-claimed element essential to the practice of the invention.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "above," and "below" and words of similar import, when used in this application, shall refer to this application as a whole and not to any particular portions of the application.

As will be understood by one of ordinary skill in the art, each embodiment disclosed herein can comprise, consist essentially of or consist of its particular stated element, step, ingredient or component. As used herein, the transition term "comprise" or "comprises" means includes, but is not limited to, and allows for the inclusion of unspecified elements, steps, ingredients, or components, even in major amounts. The transitional phrase "consisting of" excludes any element, step, ingredient or component not specified. The transition phrase "consisting essentially of" limits the scope of the embodiment to the specified elements, steps, ingredients or components and to those that do not materially affect the embodiment.

All percentages, ratios and proportions herein are by weight, unless otherwise specified.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements.

Groupings of alternative elements or embodiments of the disclosure are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified thus fulfilling the written description of all Markush groups used in the appended claims.

Some embodiments of various aspects of the disclosure are described herein, including the best mode known to the inventors for carrying out the methods described herein. Of course, variations on these described embodiments will become apparent to those of ordinary skill in the art upon reading the foregoing description. The skilled artisan will employ such variations as appropriate, and as such the methods of the disclosure can be practiced otherwise than specifically described herein. Accordingly, the scope of the disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

EXAMPLES

The methods of the disclosure are illustrated further by the following examples, which are not to be construed as limiting the disclosure in scope or spirit to the specific procedures and compounds described in them.

Preparation of Dielectric Compounds of Formula (I)

The compounds of the disclosure can be easily prepared from inexpensive starting materials, such as diols (e.g., 1,8-octanediol), triols (e.g. glycerol) and tetrols (pentaerythritol), as shown in Scheme 1.

Scheme 1

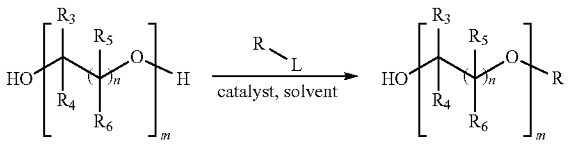

where $R_3$-$R_6$, m and n are as defined herein, R is $R_1$ or $R_2$ as defined herein, and L is a leaving group.

Example 1

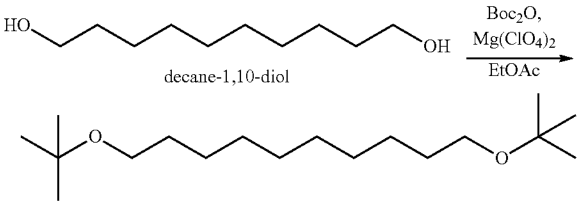

decane-1,10-diol 1,10-di-tert-butoxydecane

Decane-1,10-diol (200 g, 1.15 mol, 1.0 eq) was charged to a 10 L jacketed vessel (fitted with a temperature probe, condenser, addition funnel and an argon line) that had been purged with argon. EtOAc (1.4 L, 7.0 vol) was added and the mixture stirred while heating to 60° C. Meanwhile, $Boc_2O$ (1.76 kg, 8.03 mol, 7.0 eq) was added to a 5 L round bottom flask, followed by the addition of EtOAc (1.2 L, 6.0 vol) and mixture stirred at room temperature until fully dissolved. $Mg(ClO_4)_2$ (14.2 g, 115 mmol, 0.1 eq) was added to the solution of the decane-1,10-diol in the reaction vessel, followed by the slow addition of the $Boc_2O$ solution over 4.5 hours. Vigorous release of carbon dioxide was observed and carefully vented. The reaction was allowed to heat at 60° C. overnight. GC analysis of an aliquot showed 1,10-diol (trace), mono-ether (10%), product (69%) and a higher boiling impurity (20%). The reaction was cooled to room temperature, concentrated on a rotary evaporator (40° C., from 170 mbar to 20 mbar) to give 400 g of a clear oil. This was diluted with heptane (1 L), washed with $H_2O$ (2×100 mL) and brine (100 mL) and concentrated to give 380 g of a clear oil which contained 80% di-alkylated product. The material was purified by passing it over a plug of silica, pre-wetted with heptane. The column was flushed with heptane and several volumes of EtOAc/heptane, containing 1%, 2%, 5% and 20% EtOAc. The combined fractions were concentrated to give 323 g of a clear oil, which contained the mono-ether (3%) and di-ether product (95%). The mixture purified by fractional distillation to provide 367 g (74%) product as an oil at a purity higher than 98% by GC analysis. $^1$H-NMR (400 MHz, $CDCl_3$): δ 3.35 (4H, t, $CH_2O$), 1.50 (4H, m, $CH_2CH_2O$), 1.27 (12H, m, $CH_2$), 1.17 (18H, s, $CH_3$). $^{13}$C-NMR (400 MHz, $CDCl_3$): δ 72.47, 61.75, 30.81, 29.66, 29.61, 27.67, 26.33.

Example 2-1

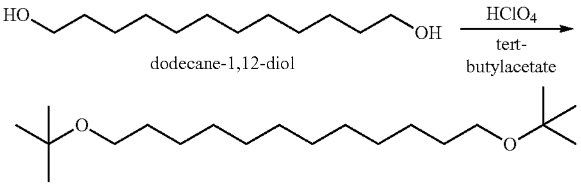

dodecane-1,12-diol 1,12-di-tert-butoxydodecane

A solution of dodecane-1,12-diol (1 g), $HClO_4$ (0.005 eq), tert-butylacetate (12.5 vol) was sealed in a reaction vial and stirred at 30° C. for 24 h. The GC analysis of the reaction mixture identified the mono-ether (2.4%), the diether product (74.7%) and the bis-acetate as a by-product (20.3%). The reaction was quenched with $Na_2CO_3$, filtered and the resulting oil was refluxed in a solution of NaOH in aqueous methanol solution, the organic phase was separated, and the product isolated by distillation at a purity higher than 98%. 1H-NMR (400 MHz, $CDCl_3$): δ 3.34 (4H, t, $CH_2O$), 1.51 (4H, m, $CH_2CH_2O$), 1.27-1.29 (14H, m, $CH_2$), 1.16 (18H, s, $CH_3$). $^{13}$C-NMR (400 MHz, $CDCl_3$): δ 72.29, 62.01, 30.19, 29.8, 29.82, 27.75, 26.75.

Example 2-2

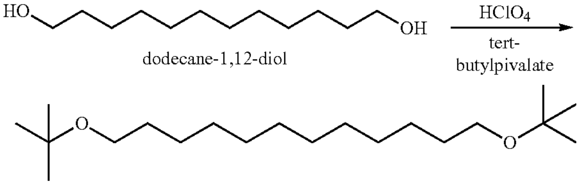

dodecane-1,12-diol 1,12-di-tert-butoxydodecane

A solution of dodecane-1,12-diol (1 g), $HClO_4$ (0.005 eq), t-butylpivalate (12.5 vol) was sealed in a reaction vial and stirred at 30° C. for 72 h. The GC analysis of the reaction mixture identified the mono-ether (2%), the diether product (89%) and a higher boiling by-product (7.4%). The reaction was quenched with $Na_2CO_3$, filtered and the product isolated by distillation at a purity higher than 98%.

Example 3

Several dielectric compounds of the disclosure and their modeled physical properties are provided in Table 2.

TABLE 2
| Compound | Boiling point (° C.) | Kinematic viscosity, KV (cSt) at 25 ° C. | at 40 ° C. | at 100 ° C. | Pour point (° C.) | Density (g/cm$^3$) | Flash point, ° C. |
|---|---|---|---|---|---|---|---|
| 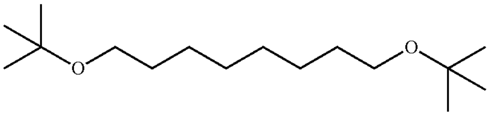 [SMILES: CC(C)(C)OCCCCCCCCOC(C)(C)C] 1,8-di-tert-butoxyoctane | 278 | 6.52 | 5.60 | 1.54 | <−60 | 0.851 | |
| 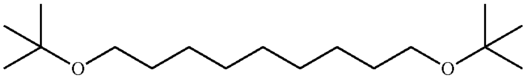 [SMILES: CC(C)(C)OCCCCCCCCCOC(C)(C)C] 1,9-di-tert-butoxynonane | 294 | 7.01 | 5.86 | 1.71 | <−60 | 0.850 | 133 |
| 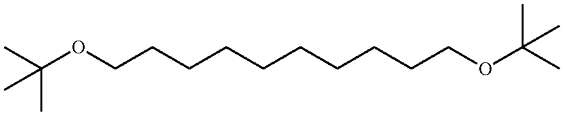 [SMILES: CC(C)(C)OCCCCCCCCCCOC(C)(C)C] 1,10-di-tert-butoxydecane | 308 | 7.79 | 6.11 | 1.93 | <−60 | 0.849 | 156 |
| 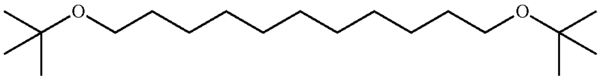 [SMILES: CC(C)(C)OCCCCCCCCCCCOC(C)(C)C] 1,11-di-tert-butoxyundecane | 322 | 8.39 | 6.36 | 2.15 | <−60 | 0.848 | |
| 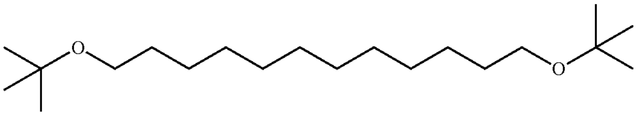 [SMILES: CC(C)(C)OCCCCCCCCCCCCOC(C)(C)C] 1,12-di-tert-butoxydodecane | 335 | 9.29 | 6.59 | 2.34 | <−60 | 0.848 | |
| 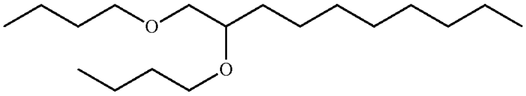 [SMILES: CCCCCCCCC(COCCCC)OCCCC] 1,2-dibutoxydecane | 310 | — | 3.38 | 1.31 | −72 | 0.849 | 143 |
| 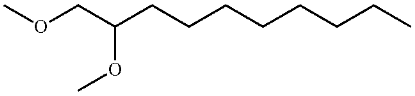 1,2-dimethoxydecane | 229 | — | 1.76 | — | −54 | 0.844 | 101.5 |
| 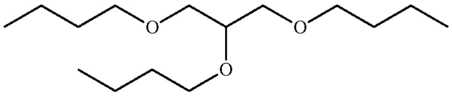 [SMILES: CCCCOCC(COCCCC)OCCCC] 1-((1,3-dibutoxypropan-2-yl)oxy)butane | 240 | — | 2.275 | 0.671 | −105 | 0.846 | 119 |
| 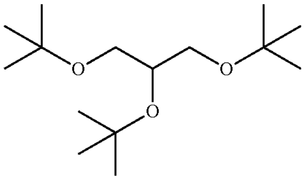 [SMILES: CC(C)(C)OCC(COC(C)(C)C)OC(C)(C)C] 1,2,3-tri-tert-butoxypropane | 232 | 12.4 | | | | 0.87 | |

TABLE 2-continued

| Compound | Boiling point (° C.) | Kinematic viscosity, KV (cSt) at 25 ° C. | at 40 ° C. | at 100 ° C. | Pour point (° C.) | Density (g/cm$^3$) | Flash point, ° C. |
|---|---|---|---|---|---|---|---|
| 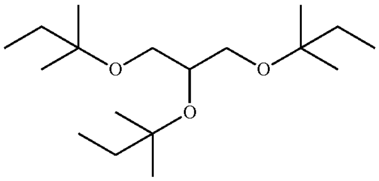 [SMILES: CCC(C)(C)OCC(COC(C)(C)CC)OC(C)(C)CC] 2-((1,3-bis(tert-pentyloxy)propan-2-yl)oxy)-2-methylbutane | 275.8 | 18.5 | | | | 0.894 | |
| 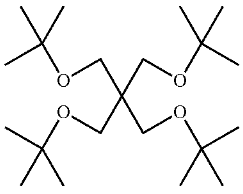 [SMILES: CC(C)(C)OCC(COC(C)(C)C)(COC(C)(C)C)COC(C)(C)C] 1,3-di-tert-butoxy-2,2-bis(tert-butoxymethyl)propane | 249 | 7.5 | | | | 0.9 | |
| 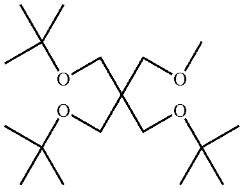 [SMILES: COCC(COC(C)(C)C)(COC(C)(C)C)COC(C)(C)C] 1,3-di-tert-butoxy-2-(tert-butoxymethyl)-2-(methoxymethyl)propane | 268 | 6.8 | | | | 0.931 | |

In addition to the above noted values, 1,10-di-tert-butoxy-decane was also estimated to have flash point of 156° C.

Other aspects of the disclosure are described with respect to the following enumerated embodiments, which may be combined in any fashion and in any number that is not technically or logically inconsistent.

Embodiment 1 is directed to a thermal management fluid comprising:

one or more dielectric compounds of formula (I):

(I)

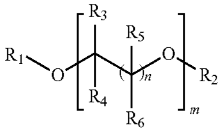

wherein n is an integer 1, 2, 3, 4, 5, 6, 7, 8, 9, 10, 11, or 12;

m is an integer 1, 2, or 3;

$R_1$ is $C_1$-$C_5$ alkyl;

$R_2$ is $C_1$-$C_5$ alkyl;

each $R_3$, $R_4$, $R_5$, and $R_6$ are independently selected from H, $C_1$-$C_8$ alkyl, and $R_7O—(CH_2)_{0-1}—$, wherein $R_7$ is $C_1$-$C_5$ alkyl, provided no more than two of $R_3$, $R_4$, $R_5$, and $R_6$ are $R_7O—(CH_2)_{0-1}—$;

the one or more dielectric compounds being present in a total amount in the range of 1 wt % to 100 wt %, based on the total weight of the thermal management fluid; and wherein the thermal management fluid has a flash point of at least 100° C., measured in accordance with ASTM D93, and the thermal management fluid has a dielectric constant of at least 1.5 at 25° C.

Embodiment 2 is directed to the thermal management fluid of embodiment 1, wherein each of the one or more compounds contains a total number of carbon atoms from 10 to 50 (e.g., from 10 to 40, from 10 to 30, from 10 to 20, from 16 to 50, from 16 to 40, from 16 to 30, from 16 to 20, from 18 to 50, from 18 to 40, from 18 to 30, from 18 to 22, from 18 to 20, from 20 to 50, from 20 to 40, or from 20 to 30).

Embodiment 3 is directed to the thermal management fluid of embodiment 1, wherein each of the one or more compounds contains a total number of carbon atoms from 12 to 22.

Embodiment 4 is directed to the thermal management fluid of any of embodiments 1-3, wherein n is an integer in the range of 5-12 (e.g., 5-10 or 5-8), and $R_3$ is H or $C_1$-$C_8$ alkyl (e.g., $C_1$-$C_6$ alkyl).

Embodiment 5 is directed to the thermal management fluid of embodiment 4, wherein n is an integer in the range of 6-12, e.g., 6-10 or 6-8; or wherein n is an integer in the range of 8-12, e.g., 8-10.

Embodiment 6 is directed to the thermal management fluid of embodiment 4 or embodiment 5, wherein $R_3$ is H.

Embodiment 7 is directed to the thermal management fluid of embodiment 4 or embodiment 5, wherein $R_3$ is methyl or ethyl.

Embodiment 8 is directed to the thermal management fluid of any of embodiments 1-3, wherein n is an integer in the range of 1-4 (e.g., 1 or 2, or 1-3), and $R_3$ is H or $C_1$-$C_8$ alkyl (e.g., $C_4$-$C_8$ alkyl, or $C_5$-$C_8$ alkyl, or $C_6$-$C_8$ alkyl).

Embodiment 9 is directed to the thermal management fluid of any of embodiments 4-8, wherein each of $R_4$, $R_5$, and $R_6$ is H.

Embodiment 10 is directed to the thermal management fluid of any of embodiments 4-9, wherein each of $R_3$, $R_4$, $R_5$, and $R_6$ is H, i.e., the compounds have the formula

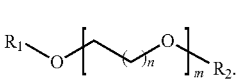

Embodiment 11 is directed to the thermal management fluid of any of embodiments 4-9, wherein each of $R_4$, $R_5$, and $R_6$ is H, and wherein $R_3$ is $C_1$-$C_8$ alkyl (such as methyl or ethyl, or such as $C_6$-$C_8$ alkyl), i.e., the compounds have the formula

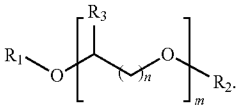

Embodiment 12 is directed to the thermal management fluid of any of embodiments 4-11, wherein m is 1, i.e., the one or more dielectric compounds have the formula

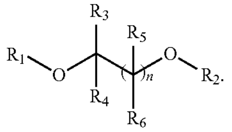

Embodiment 13 is directed to the thermal management fluid of embodiment 12, having the formula:

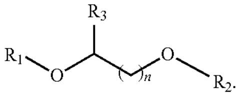

Embodiment 14 is directed to the thermal management fluid of embodiments 4-7, wherein m is 1; n is an integer 6, 7, 8, 9, or 10; and $R_4$, $R_5$ and $R_6$ are independently H.

Embodiment 15 is directed to the thermal management fluid of embodiment 14, wherein $R_1$ is $C_3$-$C_5$ alkyl; and $R_2$ is $C_3$-$C_5$ alkyl.

Embodiment 16 is directed to the thermal management fluid of embodiment 14 or embodiment 15, wherein $R_3$ is H.

Embodiment 17 is directed to the thermal management fluid of any of embodiments 1-6, wherein the one or more compounds of formula (I) have the formula

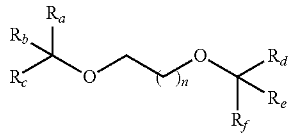

in which each of $R_a$ and $R_b$ is independently methyl, and each of $R_c$ and $R_d$ is independently methyl or ethyl.

Embodiment 18 is directed to the thermal management fluid of any of embodiments 1-3, wherein n is 1, and $R_3$ is $R_7O$—$(CH_2)_{0-1}$—, such as $R_7O$—$CH_2$—.

Embodiment 19 is directed to the thermal management fluid of embodiment 18, wherein each of $R_4$, $R_5$, and $R_6$ is H.

Embodiment 20 is directed to the thermal management fluid of embodiment 18 or 20, wherein m is 1.

Embodiment 21 is directed to the thermal management fluid of embodiment 18 wherein m is 1; and $R_4$, $R_5$ and $R_6$ are independently H.

Embodiment 22 is directed to the thermal management fluid of embodiment 21, wherein $R_1$ is $C_3$-$C_5$ alkyl; $R_2$ is $C_3$-$C_5$ alkyl; and $R_7$ is $C_3$-$C_5$ alkyl.

Embodiment 23 is directed to the thermal management fluid of any of embodiments 1-3, wherein n is 2, and one $R_5$ and one $R_6$ are independently $R_7O$—$(CH_2)_{0-1}$—, such as $R_7O$—$CH_2$—.

Embodiment 24 is directed to the thermal management fluid of embodiment 23, wherein each of $R_3$ and $R_4$ is H.

Embodiment 25 is directed to the thermal management fluid of embodiment 23 or 24, wherein m is 1.

Embodiment 26 is directed to the thermal management fluid of embodiment 23 wherein m is 1; and $R_3$, $R_4$, one of $R_5$ and one of $R_6$ is independently H.

Embodiment 27 is directed to the thermal management fluid of embodiment 26, wherein $R_1$ is $C_3$-$C_5$ alkyl; $R_2$ is $C_3$-$C_5$ alkyl; and $R_7$ is $C_3$-$C_5$ alkyl.

Embodiment 28 is directed to the thermal management fluid of any of embodiments 18-27, wherein $R_7$ is $C_3$-$C_5$ alkyl.

Embodiment 29 is directed to the thermal management fluid of any of embodiments 18-27, wherein $R_7$ is a branched $C_1$-$C_5$ alkyl, such as branched $C_3$-$C_5$ alkyl.

Embodiment 30 is directed to the thermal management fluid of embodiment 29, wherein branching of $R_7$ is at an α-position to the oxygen atom to which $R_7$ is bound.

Embodiment 31 is directed to the thermal management fluid of any of embodiments 18-27, wherein $R_7$ is —$C(R_g)(R_h)(R_i)$, wherein each of $R_g$, $R_h$, and $R_i$ is independently methyl or ethyl.

Embodiment 32 is directed to the thermal management fluid of any of embodiments 1-3, wherein the one or more compounds of formula (I) have the formula

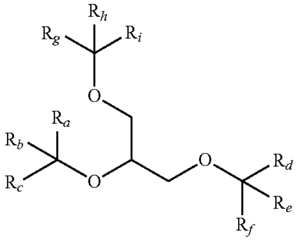

in which each of $R_a$, $R_b$, $R_d$, $R_e$, $R_g$ and $R_h$ is independently methyl, and each of $R_c$, $R_f$, and $R_i$ is independently methyl or ethyl.

Embodiment 33 is directed to the thermal management fluid of any of embodiments 1-3, wherein the one or more compounds of formula (I) have the formula

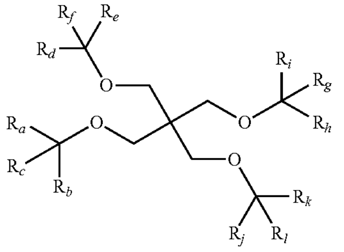

in which each of $R_a$, $R_b$, $R_d$, $R_e$, $R_g$ , $R_h$, $R_e$, $R_j$, and $R_k$ is independently methyl, and each of $R_c$, $R_f$, $R_i$, and $R_l$ is independently methyl or ethyl.

Embodiment 34 is directed to the thermal management fluid of any of embodiments 1-14, 16, 18-21, 23-26, and 28-31, wherein $R_1$ is $C_3$-$C_5$ alkyl.

Embodiment 35 is directed to the thermal management fluid of any of embodiments 1-14, 16, 18-21, 23-26, and 28-31, wherein $R_1$ is a branched $C_1$-$C_5$ alkyl, such as branched $C_3$-$C_5$ alkyl.

Embodiment 36 is directed to the thermal management fluid of embodiment 35, wherein branching of $R_1$ is at an α-position to the oxygen atom to which $R_1$ is bound.

Embodiment 37 is directed to the thermal management fluid of any of embodiments 1-14, 16, 18-21, 23-26, and 28-31, wherein $R_1$ is —$C(R_a)(R_b)(R_c)$, wherein each of $R_a$, $R_b$, and $R_c$ is independently methyl or ethyl.

Embodiment 38 is directed to the thermal management fluid of any of embodiments 1-14, 16, 18-21, 23-26, and 28-37, wherein $R_2$ is $C_3$-$C_5$ alkyl.

Embodiment 39 is directed to the thermal management fluid of any of embodiments 1-14, 16, 18-21, 23-26, and 28-37, wherein $R_2$ is a branched $C_1$-$C_5$ alkyl, such as branched $C_3$-$C_5$ alkyl.

Embodiment 40 is directed to the thermal management fluid of embodiment 39, wherein branching of $R_2$ is at an α-position to the oxygen atom to which $R_2$ is bound.

Embodiment 41 is directed to the thermal management fluid of any of embodiments 1-14, 16, 18-21, 23-26, and 28-37, wherein $R_2$ is —$C(R_d)(R_e)(R_f)$, wherein each of $R_d$, $R_e$, and $R_f$ is independently methyl or ethyl.

Embodiment 42 is directed to the thermal management fluid of embodiment 1, wherein the one or more dielectric compounds are independently selected from:

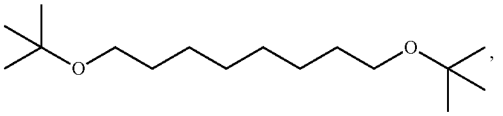

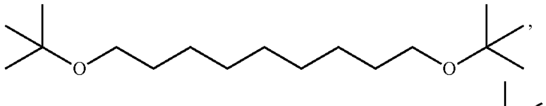

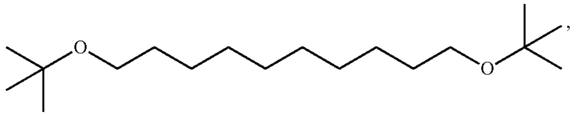

-continued

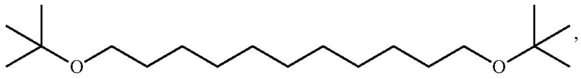

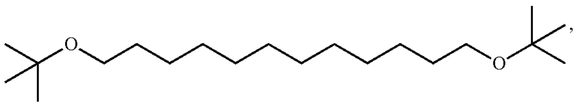

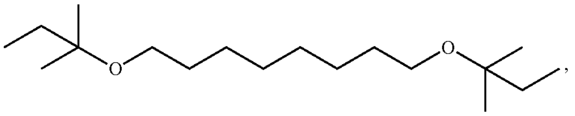

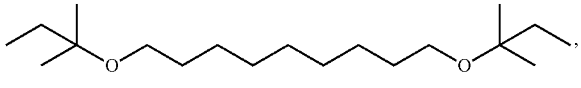

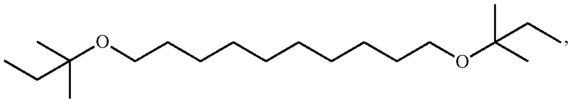

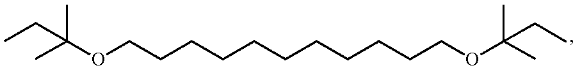

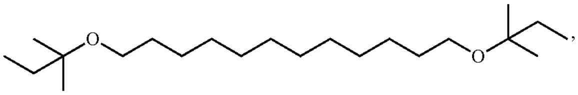

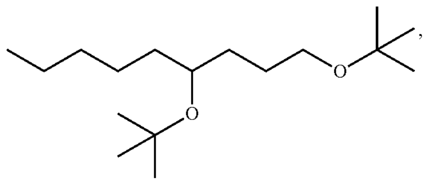

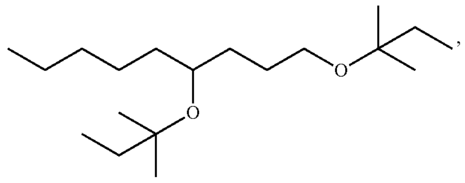

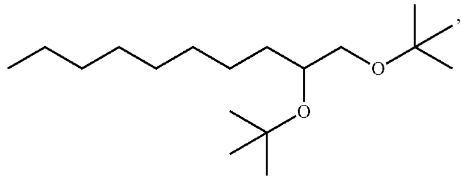

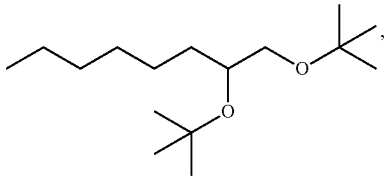

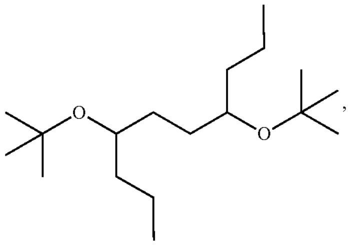

-continued
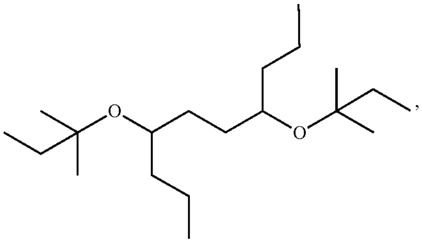
,
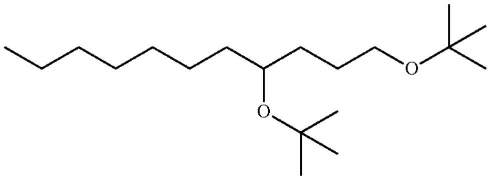
,
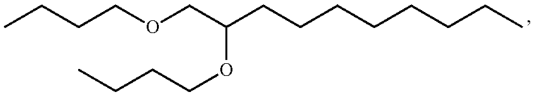
,
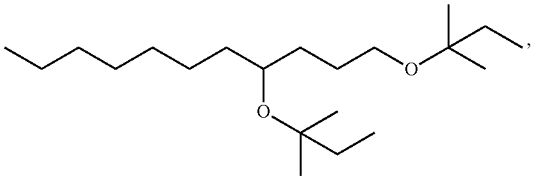
,
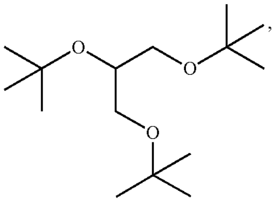
,
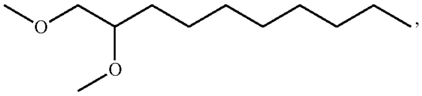
,
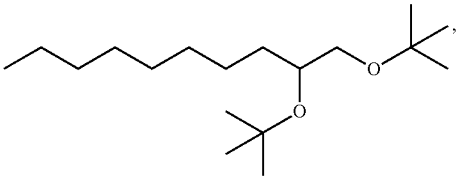
,
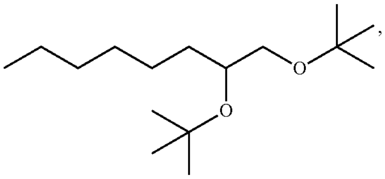
,
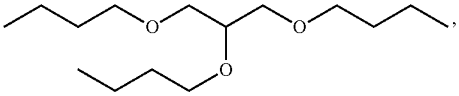
,
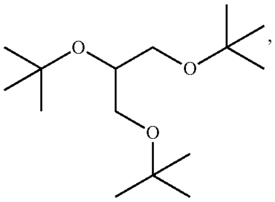
,
-continued
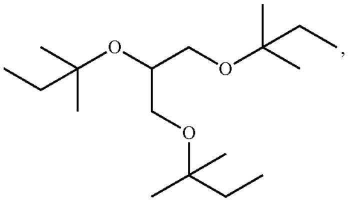
,
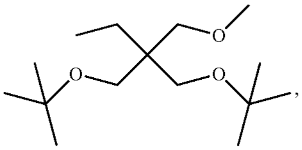
,
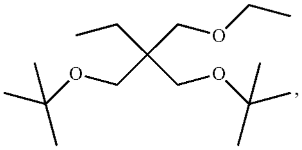
,
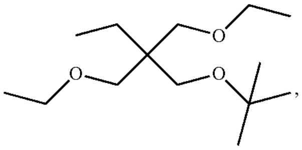
,
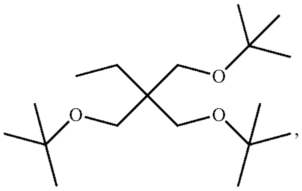
,
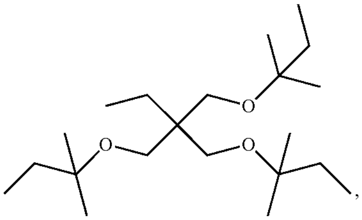
,
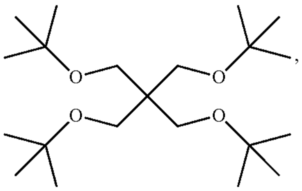
,
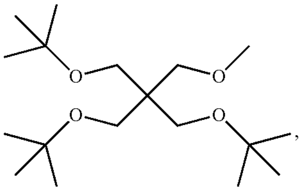
,
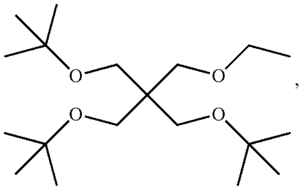
, or -continued

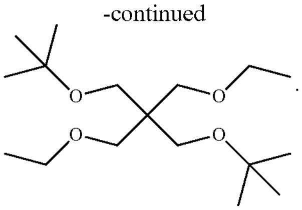

.

Embodiment 43 is directed to the thermal management fluid of embodiment 1, wherein the dielectric compound is:

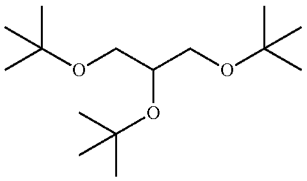

,

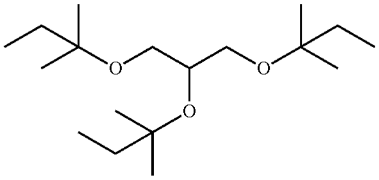

,

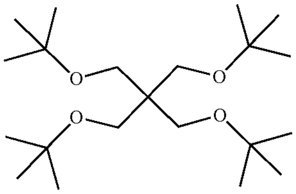

, or

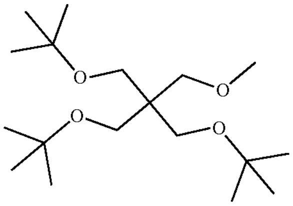

.

Embodiment 44 is directed to the thermal management fluid any of embodiments 1-43, wherein the one or more dielectric compounds has a flash point of at least 100° C., for example, at least 110° C. (e.g., at least 120° C., 125° C., 130° C., or 135° C.), or at least 140° C. (e.g., at least 145° C., 150° C., or 155° C.), measured in accordance with ASTM D93.

Embodiment 45 is directed to the thermal management fluid of any of embodiments 1-44, wherein the one or more dielectric compounds has a kinematic viscosity at 40° C. in the range of 1.5 to 20 cSt, e.g., in the range of 1.5 to 15 cSt, or 3 to 20 cSt, or 3 to 15 cSt, or 5 to 20 cSt, or 5 to 15 cSt, as measured in accordance with ASTM D455.

Embodiment 46 is directed to the thermal management fluid of any of embodiments 1-44, wherein the one or more dielectric compounds has a kinematic viscosity at 40° C. in the range of 1.5 to 10 cSt, e.g., 1.5 to 8 cSt, or 1.5 to 6 cSt, or 3 to 10 cSt, or 3 to 8 cSt, or 3 to 6 cSt, or 5 to 10 cSt, or 5 to 8 cSt, or 5 to 6 cSt, or 6 to 10 cSt, or 8 to 10 cSt, as measured in accordance with ASTM D455.

Embodiment 47 is directed to the thermal management fluid of any of embodiments 1-44, wherein the one or more dielectric compounds has a kinematic viscosity at 40° C. in the range of 1.5 to 5 cSt, or 1.5 to 4 cSt, or 1.5 to 3 cSt, or 3 to 5 cSt, or 3 to 4 cSt, or 4 to 5 cSt, as measured in accordance with ASTM D455.

Embodiment 48 is directed to the thermal management fluid of any of embodiments 1-47, wherein the one or more dielectric compounds is present in an amount in the range of 5 wt % to 100 wt %, or 10 wt % to 100 wt %, or 20 wt % to 100 wt %, based on the total weight of the thermal management fluid.

Embodiment 49 is directed to the thermal management fluid of any of embodiments 1-47 wherein the one or more dielectric compounds is present in an amount in the range of 50 wt % to 100 wt %, for example, 75 wt % to 100 wt %, or 85 wt % to 100 wt %, or 90 wt % to 100 wt %, or 95 wt % to 100 wt %, or 98 wt % to 100 wt %, based on the total weight of the thermal management fluid.

Embodiment 50 is directed to the thermal management fluid of any of embodiments 1-47, wherein the one or more dielectric compounds is present in an amount in the range of 1 wt % to 99.9 wt % (e.g., 5 wt % to 99.9 wt %, or 10 wt % to 99.9 wt %, or 20 wt % to 99.9 wt %), or 50 wt % to 99.9 wt %, for example, 75 wt % to 99.9 wt %, or 85 wt % to 99.9 wt %, or 90 wt % to 99.9 wt %, or 95 wt % to 99.9 wt %, or 98 wt % to 99.9 wt %, based on the total weight of the thermal management fluid.

Embodiment 51 is directed to the thermal management fluid of any of embodiments 1-47, wherein the one or more dielectric compounds is present in an amount in the range of 1 wt % to 99 wt % (e.g., 5 wt % to 99 wt %, or 10 wt % to 99 wt %, or 20 wt % to 99 wt %), or 50 wt % to 99 wt %, for example, 80 wt % to 99 wt %, or 85 wt % to 99 wt %, or 90 wt % to 99 wt %, or 95 wt % to 99 wt %, based on the total weight of the thermal management fluid.

Embodiment 52 is directed to the thermal management fluid of any of embodiments 1-47, wherein the one or more dielectric compounds is present in an amount in the range of 1 wt % to 95 wt % (e.g., 5 wt % to 95 wt %, or 10 wt % to 95 wt %, or 20 wt % to 95 wt %), or 50 wt % to 95 wt %, for example, 75 wt % to 95 wt %, or 85 wt % to 95 wt %; or 1 wt % to 85 wt % (e.g., 5 wt % to 85 wt %, or 10 wt % to 85 wt %, or 20 wt % to 85 wt %), or 50 wt % to 85 wt %, for example, 65 wt % to 85 wt %, or 75 wt % to 85 wt %, based on the total weight of the thermal management fluid.

Embodiment 53 is directed to the thermal management fluid of any of embodiments 1-52, further comprising a Group II, Group III, Group IV, or a Group V base oil.

Embodiment 54 is directed to the thermal management fluid of any of embodiments 1-52, further comprising a Group II or Group III base oil.

Embodiment 55 is directed to the thermal management fluid of any of embodiments 1-52, further comprising a Group IV base oil (such as polyalphaolefins (PAO)).

Embodiment 56 is directed to the thermal management fluid of any of embodiments 1-52, further comprising an ester base oil stock.

Embodiment 57 is directed to the thermal management fluid of any of embodiments 1-56, further comprising one or more of corrosion inhibitors, anti-oxidants (such as phenolic and aminic anti-oxidants), pour point depressants, anti-foams, defoamers, viscosity index modifiers, preservatives, biocides, surfactants, seal swell additives, flame retardants, and combinations thereof, e.g., in an amount up to 0.5 wt %, up to 1.0 wt %, or up to 5.0 wt %.

Embodiment 58 is directed to the thermal management fluid of any of embodiments 1-57, further comprising one or more flame retardants, e.g., in an amount up to 20 wt %, up to 10 wt %, or up to 5 wt %.

Embodiment 59 is directed to the thermal management fluid of any of embodiments 1-58, wherein the thermal management fluid has a flash point of at least 110° C., e.g., at least 120° C., at least 125° C., at least 130° C., or at least 135° C., measured in accordance with ASTM D93.

Embodiment 60 is directed to the thermal management fluid of any of embodiments 1-58, wherein the thermal management fluid does has a flash point of at least 140° C., e.g., at least 145° C., at least 150° C. or at least 150° C., measured in accordance with ASTM D93.

Embodiment 61 is directed to the thermal management fluid of any of embodiments 1-60, having a kinematic viscosity at 40° C. in the range of 1.5 to 20 cSt, e.g., in the range of 1.5 to 15 cSt, or 3 to 20 cSt, or 3 to 15 cSt, or 5 to 20 cSt, as measured in accordance with ASTM D455.

Embodiment 62 is directed to the thermal management fluid of any of embodiments 1-60, having a kinematic viscosity at 40° C. in the range of 1.5 to 10 cSt, e.g., 1.5 to 8 cSt, or 1.5 to 6 cSt, or 3 to 10 cSt, or 3 to 8 cSt, or 3 to 6 cSt, or 5 to 10 cSt, or 5 to 8 cSt, or 5 to 6 cSt, or 6 to 10 cSt, or 8 to 10 cSt, as measured in accordance with ASTM D455.

Embodiment 63 is directed to the thermal management fluid of any of embodiments 1-60, having a kinematic viscosity at 40° C. in the range of 1.5 to 5 cSt, or 1.5 to 4 cSt, or 1.5 to 3 cSt, or 3 to 5 cSt, or 3 to 4 cSt, or 4 to 5 cSt, as measured in accordance with ASTM D455.

Embodiment 64 is directed to the thermal management fluid of any of embodiments 1-63, having a dielectric constant of at least 1.75, e.g., at least 2.0, or at least 2.25, as measured at 25° C.

Embodiment 65 is directed to the thermal management fluid of any of embodiments 1-63, having a dielectric constant in the range of 1.5 to 10, or 1.8 to 10, or 1.5 to 2.8, or 1.8 to 2.8.

Embodiment 66 is directed to the thermal management fluid of any of embodiments 1-65, having density of no more than 1.1 $g/cm^3$ at 25° C. (e.g., no more than 1 $g/cm^3$ at 25° C.).

Embodiment 67 is directed to the thermal management fluid of any of embodiments 1-66, having a thermal conductivity in the range of 0.05 W/m·K to 1 W/m·K at 25° C.

Embodiment 68 is directed to the thermal management fluid of any of embodiments 1-67, having a specific heat capacity of at least 1 J/g·K (e.g., at least 1.2 J/g·K, or at least 1.5 J/g·K at 25° C.).

Embodiment 69 is directed to the thermal management fluid of any of embodiments 1-68, having a coefficient of thermal expansion of no more than $1100\times10^{-6}$/K (e.g., no more than $1050\times10^{-6}$/K, or no more than $1000\times10^{-6}$/K).

Embodiment 70 is directed to a method comprising:

contacting a thermal management fluid of embodiments 1-69 with a surface having a temperature of at least 25° C., the surface being in substantial thermal communication with a heat source; and absorbing thermal energy in the thermal management fluid from the heat source through the surface.

Embodiment 71 is directed to the method according to embodiment 70, wherein the surface has a temperature of at least 30° C., e.g., at least 40° C.

Embodiment 72 is directed to the method according to embodiment 70, wherein the surface has a temperature in the range of 25° C. to 150° C., e.g., 25° C. to 100° C., or 25° C. to 90° C., or 25° C. to 85° C., or 25° C. to 80° C., or 25° C. to 75° C., or 25° C. to 70° C.

Embodiment 73 is directed to the method according to embodiment 70, wherein the surface has a temperature in the range of 30° C. to 150° C., e.g., 30° C. to 100° C., or 30° C. to 90° C., or 30° C. to 85° C., or 30° C. to 80° C., or 30° C. to 75° C., or 30° C. to 70° C.

Embodiment 74 is directed to the method according to embodiment 70, wherein the surface has a temperature in the range of 40° C. to 150° C., e.g., 50° C. to 150° C., or 60° C. to 150° C., or 70° C. to 150° C., or 80° C. to 150° C., or 90° C. to 150° C., or 100° C. to 150° C., or 110° C. to 150° C.

Embodiment 75 is directed to the method according to embodiment 70, wherein the surface has a temperature in the range of 50° C. to 150° C., e.g., 50° C. to 140° C., or 50° C. to 130° C., or 50° C. to 120° C., or 50° C. to 110° C., or 50° C. to 100° C., or 50° C. to 90° C., or 50° C. to 80° C.

Embodiment 76 is directed to the method according to any of embodiments 70-75, wherein the thermal management fluid is a stationary (i.e., not circulating) body of fluid.

Embodiment 77 is directed to the method according to any of embodiments 70-75, wherein the contacting is performed by circulating the thermal management fluid over the surface.

Embodiment 78 is directed to the method according to any of embodiments 70-75, wherein the contacting is performed by circulating the thermal management fluid between a heat exchanger and the surface.

Embodiment 79 is directed to the method according to any of embodiments 70-78, wherein the heat source is an operating electrical component.

Embodiment 80 is directed to the method according to any of embodiments 70-78, wherein the heat source is a battery pack, a capacitor, inverter, electrical cabling, a fuel cell, a motor, a computer, or high power charging equipment.

Embodiment 81 is directed to the method according to any of embodiments 70-78, wherein the heat source is an electrochemical cell.

Embodiment 82 is directed to the method of embodiment 81, wherein the electrochemical cell is selected from solid state electrochemical cells, lithium-sulfur electrochemical cells, lithium iron phosphate electrochemical cells, lithium-ion polymer electrochemical cells, sodium-ion electrochemical cells, aluminum-ion cells, lead-acid cells, and magnesium-ion cells.

Embodiment 83 is directed to the method according to any of embodiments 70-82, wherein the surface is an internal surface of a conduit in substantial thermal communication with the heat source.

Embodiment 84 is directed to the method according to embodiment 83, wherein the conduit passes through a housing that surrounds the electrical component.

Embodiment 85 is directed to a battery system comprising:

a housing;

one or more electrochemical cells disposed in the housing;

a fluid path extending in the housing and in substantial thermal communication with the one or more electrochemical cells; and a thermal management fluid of any of embodiments 1-69 disposed in the fluid path.

Embodiment 86 is directed to the battery system of embodiment 85, wherein the electrochemical cells are lithium-ion electrochemical cells.

Embodiment 87 is directed to the battery system of embodiment 85, wherein the electrochemical cells are solid state electrochemical cells, lithium-sulfur electrochemical cells, lithium iron phosphate electrochemical cells, lithium-ion polymer electrochemical cells, sodium-ion electrochemical cells, aluminum-ion cells, lead-acid cells, or magnesium-ion cells.

Embodiment 88 is directed to an electric vehicle comprising the battery system of any of embodiments 85-87.

Embodiment 89 is directed to a thermal management circuit comprising:

a fluid path extending around and/or through a heat source;

a thermal management fluid of any of embodiments 1-69, disposed in and configured to circulate in the fluid path and to absorb thermal energy produced by the heat source, wherein the fluid is disposed in the fluid path, the heat exchanger, the pump and the connecting duct.

Embodiment 90 is directed to a method for preparing the thermal management fluid of any of embodiments 1-69, the method comprising:

contacting a compound of formula (II)

(II)

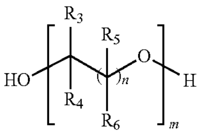

wherein n is an integer 1, 2, 3, 4, 5, 6, 7, 8, 9, 10, 11, or 12;

m is an integer 1, 2, or 3;

each $R_3$, $R_4$, $R_5$, and $R_6$ are independently selected from H, $C_1$-$C_8$ alkyl, and $R_7O—(CH_2)_{0-1}—$, wherein $R_7$ is H or $C_1$-$C_5$ alkyl, provided no more than two of $R_3$, $R_4$, $R_5$, and $R_6$ are $R_7O—(CH_2)_{0-1}—$;

with ($C_1$-$C_5$ alkyl)-L, wherein L is a leaving group to obtain a dielectric compound of formula (I).

Embodiment 91 is directed to the method of embodiment 90, wherein the contacting of the compound of formula (II) with ($C_1$-$C_5$ alkyl)-L is in the presence of a catalyst.

Embodiment 92 is directed to the method of embodiment 90 or 91, further comprising admixing the dielectric compound in an amount in the range of 1 wt % to 99.9 wt %, based on the total weight of the thermal management fluid, with one or more of base oils, corrosion inhibitors, anti-oxidants (such as phenolic and aminic anti-oxidants), pour point depressants, antifoams, defoamers, viscosity index modifiers, preservatives, biocides, surfactants, seal swell additives, flame retardants, and combinations thereof.

In closing, it is to be understood that the various embodiments herein are illustrative of the methods of the disclosures. Other modifications that may be employed are within the scope of the disclosure. Thus, by way of example, but not of limitation, alternative configurations of the methods may be utilized in accordance with the teachings herein. Accordingly, the methods of the present disclosure are not limited to that precisely as shown and described.

We claim:

1. A method comprising:

contacting a thermal management fluid with a surface having a temperature of at least 25° C., the surface being in substantial thermal communication with a heat source; and absorbing thermal energy in the thermal management fluid from the heat source through the surface;

wherein the thermal management fluid comprises one or more dielectric compounds of formula (I):

(I)

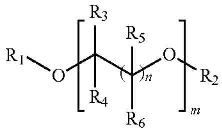

wherein n is an integer 1, 2, 3, 4, 5, 6, 7, 8, 9, 10, 11, or 12;

m is an integer 1;

$R_1$ is $C_1$-$C_5$ alkyl;

$R_2$ is $C_1$-$C_5$ alkyl;

each $R_3$, $R_4$, $R_5$, and $R_6$ are independently selected from H, $C_1$-$C_8$ alkyl, and $R_7O—(CH_2)_{0-1}$-, wherein $R_7$ is $C_1$-$C_5$ alkyl, provided no more than two of $R_3$, $R_4$, $R_5$, and $R_6$ are $R_7O—(CH_2)_{0-1}$-;

the one or more dielectric compounds being present in a total amount in the range of 20 wt % to 100 wt %, based on the total weight of the thermal management fluid; and wherein the thermal management fluid has a flash point of at least 100° C., measured in accordance with ASTM D93, and the thermal management fluid has a dielectric constant of at least 1.5 at 25° C.

2. The method of claim 1, wherein each of the one or more compounds contains a total number of carbon atoms from 10 to 50; or wherein each of the one or more compounds contains a total number of carbon atoms from 12 to 22.

3. The method of claim 1, wherein n is an integer in the range of 5-12, and $R_3$ is H or $C_1$-$C_8$ alkyl; or wherein n is an integer in the range of 1-4, and $R_3$ is H or $C_1$-$C_8$ alkyl.

4. The method of claim 3, wherein each of $R_4$, $R_5$, and $R_6$ is H, i.e., the compounds have the formula

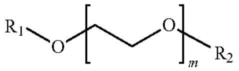

or

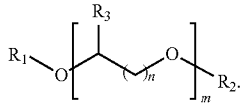

5. The method of claim 1, wherein n is 1, and $R_3$ is $R_7O—(CH_2)_{0-1}$-.

6. The method of claim 1, wherein n is 2, and one $R_5$ and one $R_6$ are independently $R_7O—(CH_2)_{0-1}$-.

7. The method of claim 1, wherein $R_1$ is $C_3$-$C_5$ alkyl, or $R_1$ is a branched $C_1$-$C_5$ alkyl, or $R_1$ is —$C(R_a)(R_b)(R_c)$, wherein each of $R_a$, $R_b$, and $R_c$ is independently methyl or ethyl; and/or $R_2$ is $C_3$-$C_5$ alkyl, or $R_2$ is a branched $C_1$-$C_5$ alkyl, or $R_2$ is —$C(R_a)(R_b)(R_c)$, wherein each of $R_a$, $R_b$, and $R_c$ is independently methyl or ethyl; and/or if present, $R_7$ is $C_3$-$C_5$ alkyl, or $R_7$ is a branched $C_1$-$C_5$ alkyl, or $R_7$ is —$C(R_g)(R_h)(R_i)$, wherein each of $R_g$, $R_h$, and $R_i$ is independently methyl or ethyl.

8. The method of claim 1, wherein the one or more compounds of formula (I) have the formula

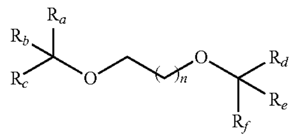
in which each of $R_a$ and $R_b$ is independently methyl, and each of $R_c$, $R_d$, $R_e$ and $R_f$ is independently methyl or ethyl.
9. The method of claim 1, wherein the one or more dielectric compounds are independently selected from:
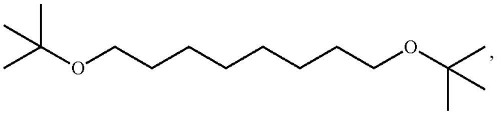,
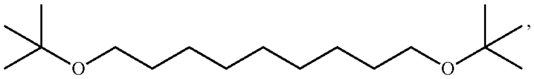,
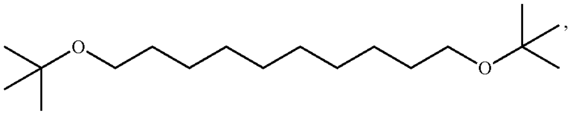,
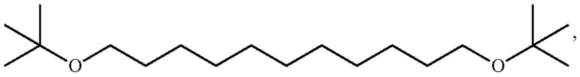,
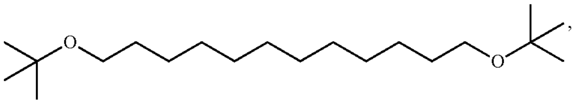,
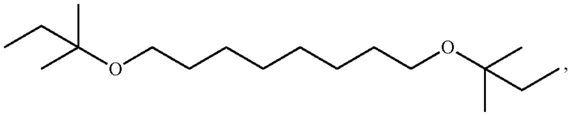,
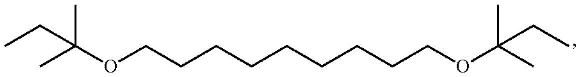,
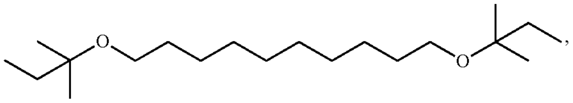,
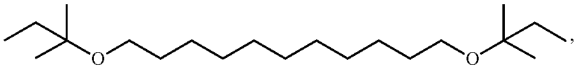,
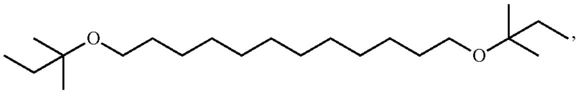,
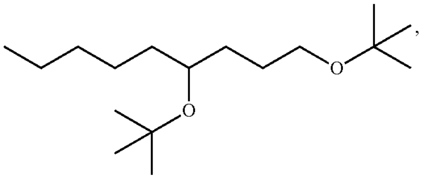,
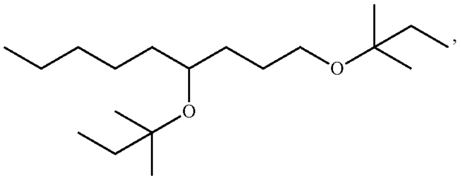,
-continued
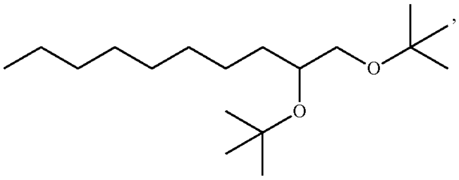,
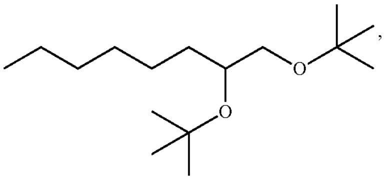,
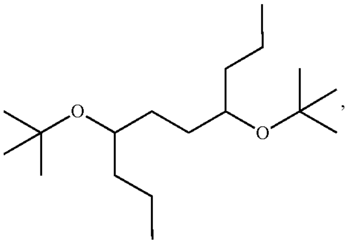,
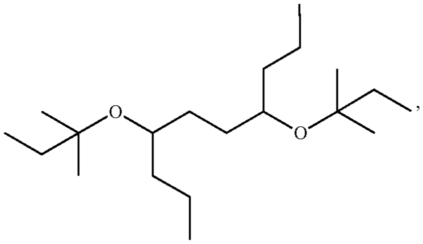,
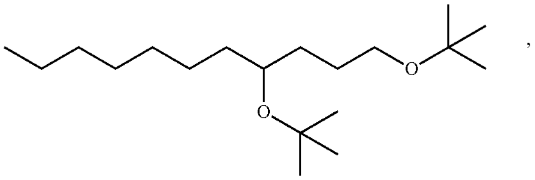,
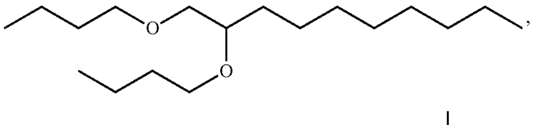,
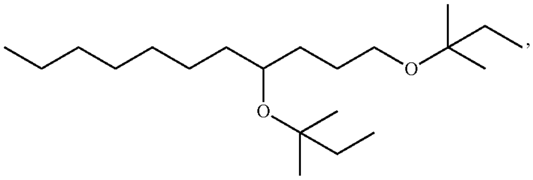,
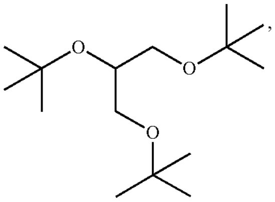,
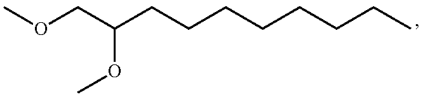, -continued

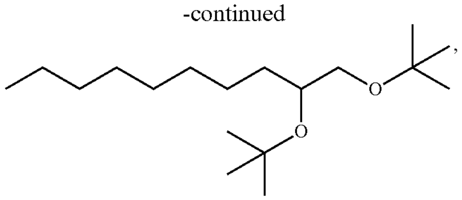

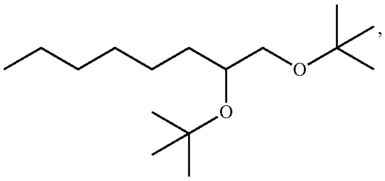

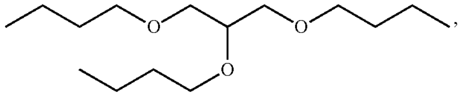

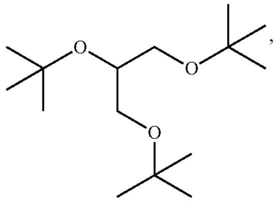

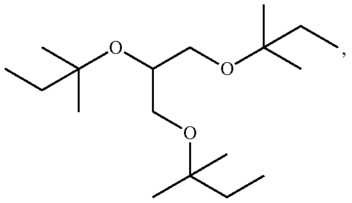

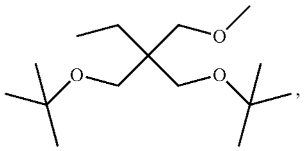

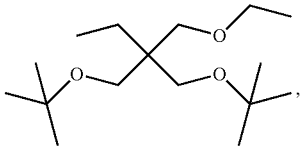

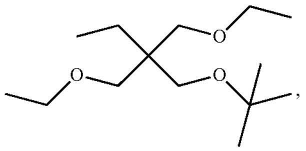

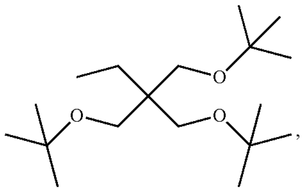

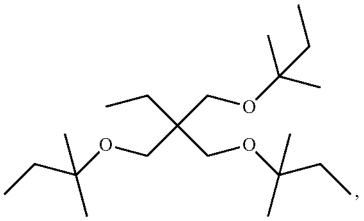

-continued

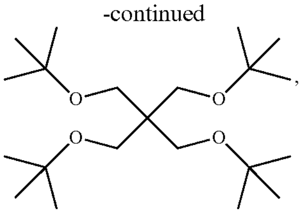

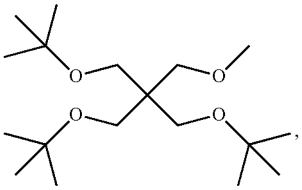

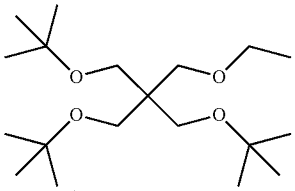

, or

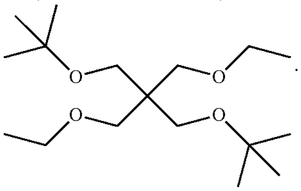

10. The method of claim 1, wherein the one or more dielectric compounds is present in the thermal management fluid in an amount in the range of 50 wt % to 99.9 wt %.

11. The method of claim 1, wherein the thermal management fluid has a flash point of at least 100° C., as measured in accordance with ASTM D93, and a kinematic viscosity at 40° C. in the range of 1.5 to 20 cSt, as measured in accordance with ASTM D455.

12. A thermal management circuit comprising:

a fluid path extending around and/or through a heat source;

a thermal management fluid, disposed in and configured to circulate in the fluid path and to absorb thermal energy produced by the heat source, wherein the thermal management fluid comprises one or more dielectric compounds of formula (I):

(I)

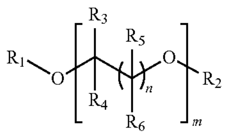

wherein n is an integer 1, 2, 3, 4, 5, 6, 7, 8, 9, 10, 11, or 12;

m is an integer 1;

$R_1$ is $C_1$-$C_5$ alkyl;

$R_2$ is $C_1$-$C_5$ alkyl;

each $R_3$, $R_4$, $R_5$, and $R_6$ are independently selected from H, $C_1$-$C_8$ alkyl, and $R_7O—(CH_2)_{0-1}$-, wherein $R_7$ is $C_1$-$C_5$ alkyl, provided no more than two of $R_3$, $R_4$, $R_5$, and $R_6$ are $R_7O—(CH_2)_{0-1}$-;

the one or more dielectric compounds being present in a total amount in the range of 20 wt % to 100 wt %, based on the total weight of the thermal management fluid; and wherein the thermal management fluid has a flash point of at least 100° C., measured in accordance with ASTM D93, and the thermal management fluid has a dielectric constant of at least 1.5 at 25° C.

13. The method of claim 1, wherein the surface has a temperature in the range of 50 to 150° C.

14. The method of claim 1, wherein the contacting is performed by circulating the thermal management fluid over the surface.

15. The method of claim 1, wherein the heat source is a battery pack, a capacitor, an inverter, electrical cabling, a fuel cell, a motor, a computer, or a high power charging equipment.

16. The method of claim 1, wherein the one or more compounds of formula (I) have the formula

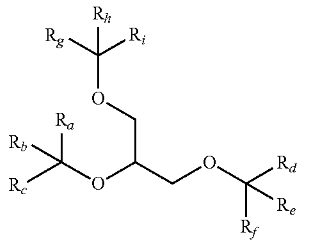

in which each of $R_a$, $R_b$, $R_d$, $R_e$, $R_g$ and $R_h$ is independently methyl, and each of $R_c$, $R_f$, and $R_i$ is independently methyl or ethyl.

17. The method of claim 1, wherein the one or more compounds of formula (I) have the formula

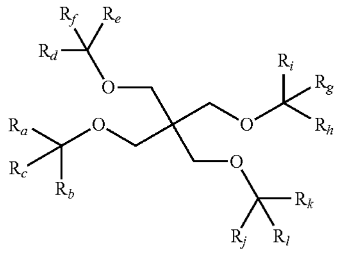

in which each of $R_a$, $R_b$, $R_d$, $R_e$, $R_g$, $R_h$, $R_j$, and $R_k$ is independently methyl, and each of $R_c$, $R_f$, $R_i$, and $R_l$ is independently methyl or ethyl.

18. The thermal management circuit of claim 12, wherein the heat source is one or more electrochemical cells disposed in a battery system comprising:

a housing; and the one or more electrochemical cells disposed in the housing.

19. The method of claim 1, wherein the one or more compounds of formula (I) have the formula

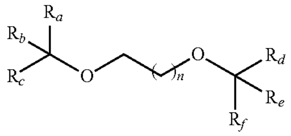

wherein n is an integer 1, 2, 3, 4, 5, 6, 7, 8, 9, 10, 11, or 12; and each of $R_a$ and $R_b$ is independently methyl, and each $R_c$, $R_d$, $R_e$ and $R_f$ is independently methyl or ethyl.

20. A thermal management fluid comprising:

one or more compounds of formula (I) having the formula

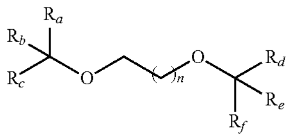

wherein n is an integer 1, 2, 3, 4, 5, 6, 7, 8, 9, 10, 11, or 12; and each of $R_a$ and $R_b$ is independently methyl, and each $R_c$, $R_d$, $R_e$ and $R_f$ is independently ethyl;

the one or more dielectric compounds being present in a total amount in the range of 20 wt % to 100 wt %, based on the total weight of the thermal management fluid; and wherein the thermal management fluid has a flash point of at least 100° C., measured in accordance with ASTM D93, and the thermal management fluid has a dielectric constant of at least 1.5 at 25° C.

* * * * *